United States Patent
Smith et al.

[11] Patent Number: 6,084,450
[45] Date of Patent: Jul. 4, 2000

[54] PWM CONTROLLER WITH ONE CYCLE RESPONSE

[75] Inventors: K. Mark Smith; Zheren Lai; Keyue M. Smedley, all of Irvine, Calif.

[73] Assignee: The Regents of the University of California, Oakland, Calif.

[21] Appl. No.: 09/023,335

[22] Filed: Feb. 13, 1998

Related U.S. Application Data

[60] Provisional application No. 60/039,743, Feb. 14, 1997.

[51] Int. Cl.$^7$ ........................................................ H03K 7/08
[52] U.S. Cl. ............................................ 327/172; 327/176
[58] Field of Search .................................... 327/171–176; 363/17; 323/284

[56] References Cited

U.S. PATENT DOCUMENTS

| | | | |
|---|---|---|---|
| 3,659,184 | 4/1972 | Schwarz | 363/15 |
| 4,577,154 | 3/1986 | Takagi et al. | 327/176 |
| 4,843,339 | 6/1989 | Burt | 330/10 |
| 5,278,490 | 1/1994 | Smedley | 323/284 |
| 5,617,306 | 4/1997 | Lai et al. | 363/17 |
| 5,877,637 | 3/1999 | Trofimenkoff et al. | 327/101 |

*Primary Examiner*—Tuan T. Lam
*Attorney, Agent, or Firm*—John P. O'Banion

[57] ABSTRACT

A new nonlinear control technique that has one cycle response, does not need a resettable integrator in the control path, and has nearly constant switching frequency. It obtains one cycle response by forcing the error between the switched-variable and the control reference to zero each cycle, while the on-pulse of the controller is adjusted each cycle to ensure near constant switching frequency. The small switching frequency variation due to variations in the reference signal and supply voltage and delays in the circuit are quantified. Using double-edge modulation, the switching frequency variation is further reduced, thus the associated signal distortion is minimized. An experimental 0–20 kHz bandwidth, 95 Watt RMS power audio amplifier using the control method demonstrates the applicability of this control technique for high fidelity audio applications. The amplifier has a power supply ripple rejection (PSRR) of 63 dB at 120 Hz. Additionally, the total harmonic distortion plus noise (THD+N) is less is than 0.07% measured with a power supply ripple of 15%.

1 Claim, 23 Drawing Sheets

Vo: 20v/div   V_g: 20v/div   Horizontal Scale: 10ms/div

pages 1-2 …

PWM CONTROLLER WITH ONE CYCLE RESPONSE

CROSS-REFERENCE TO RELATED APPLICATIONS

This application claims priority from U.S. provisional application Ser. No. 60/039,743 filed on Feb. 14, 1997.

BACKGROUND OF THE INVENTION

1. Field of the Invention

This invention pertains generally to pulse-width modulators, and more particularly to a pulse width modulator that has one cycle response, does not require a resettable integrator in the control path, and has nearly constant switching frequency.

2. Description of the Background Art

Switching converters are most often controlled with pulse-width modulation (PWM). PWM is generally realized by comparing a modulation signal with a sawtooth signal. Linear feedback has traditionally been used to achieve control over certain state variables in the switching converters. However, nonlinear control of PWM switching converters has shown excellent improvement compared to linear feedback methods at optimizing system response, reducing the distortion, and rejecting power supply disturbances. These techniques improve performance over the linearly controlled techniques by directly controlling the switching variables (e.g. switched voltage or current) rather than correcting the error after it has occurred. U.S. Pat. No. 5,278,490, which is incorporated herein by reference, describes several approaches that ensure the switching variable exactly equals the control reference each switching period and thus have one cycle response. The constant frequency approach in U.S. Pat. No. 5,278,490 is simple, robust, and has been applied to high fidelity class-D audio applications as shown, for example, in U.S. Pat. No. 5,617,306 which is also incorporated herein by reference. This technique requires a fast reset circuit and integrator to minimize signal distortion during the reset period. The constant on-time version of U.S. Pat. No. 5,278,490 and the method described in U.S. Pat. No. 3,659,184 which is further incorporated herein by reference are also simple techniques providing one cycle response by ensuring the error between the switched-variable and the control reference is zero each cycle. A nice feature of these techniques is that they do not need a re-settable integrator, reducing component speed requirements. However, their switching frequency is widely changing (over 10 times), which deteriorates performance.

Class-D power amplifiers for high fidelity audio amplification require wide bandwidth and low distortion, which imposes a great challenge to the conventional PWM method. Because of the general applicability of linear feedback to the control of many different dynamic systems, it is not surprising that it has also been applied to control PWM amplifiers. However, due to the non-linear nature of switching circuits, one cycle control has several distinct advantages when considering the design of the DC power supply and the switching amplifier power stage. Linear feedback methods are susceptible to the power supply ripple, dead time control, and non-ideal switching edges causing distortion. Therefore, to alleviate these problems, the power source is designed to stringent requirements adding cost, complexity, and weight to the system. Furthermore, it is difficult to apply soft switching methods because they induce resonant switching edges which also add distortion to the system. Since the constant frequency one cycle response methods ensure that each cycle the average value of the switched-variable equals the control reference, they inherently reject power supply disturbances and non-ideal switching edges, dramatically lowering the power source regulation requirements and easily allowing soft switching to be used. For one cycle control methods with widely changing switching frequencies, these advantages are not as prevalent since the frequency modulation effect induces distortion.

SUMMARY OF THE INVENTION

The present invention pertains generally to a new non-linear control technique that has one cycle response, does not need a fast resettable integrator in the control path, and is suitable for controlling high bandwidth amplifiers with excellent performance. It obtains one cycle response similar to the non-constant switching methods described in U.S. Pat. No. 5,278,490 by forcing the error between the averaged switched-variable and the control reference to zero each cycle. However, unlike these methods, the on-pulse or off-pulse of the controller of the present invention is adjusted each cycle by a circuit that ensures almost constant switching frequency. It will be appreciated that there will be some switching frequency variation due to the variation in power supply and reference signals and delays in the control circuitry, and quantification of these effects are described herein. Additionally, in the description that follows, the invention is applied to control a 0 kHz to 20 kHz bandwidth power amplifier, and the experimental frequency response, THD+N and power supply ripple rejection (PSRR) are given.

In accordance with an aspect of the invention, a PWM control method is provided for controlling a switched variable such that the average of the switched variable in one cycle is equal or proportional to a reference signal each cycle. Control of the cycle average can be achieved by integrating the error between the switched variable and the reference signal, wherein the switch will be forced to change its state when the error reaches zero. In addition, the width of the first on-period or off-period pulse is adjusted to achieve near constant switching frequency. The switching frequency adjustment can be achieved by means of feedback, feedforward, adaptive, or nonlinear predictive control.

In accordance with another aspect of the invention, a PWM controller for controlling a switched variable with one cycle response is provided which comprises an error integrator circuit, a comparator circuit and an adjustable one shot pulse circuit. When the one shot pulse circuit is activated, the switch is triggered to change its state. The error between the switched variable and a reference signal is integrated and compared with a fixed voltage (zero or any constant). The error will monotonically grow until the switch changes its state as the one shot pulse turns off. When the integrated error reaches zero, the comparator will change state and activate the one shot pulse circuit again, thus triggering the switch to change its state and marking the starting point of a new cycle.

BRIEF DESCRIPTION OF THE DRAWINGS

The invention will be more fully understood by reference to the following drawings which are for illustrative purposes only.

DESCRIPTION OF THE PREFERRED EMBODIMENTS

I. PWM Controller with One Cycle Response

Figure 1:
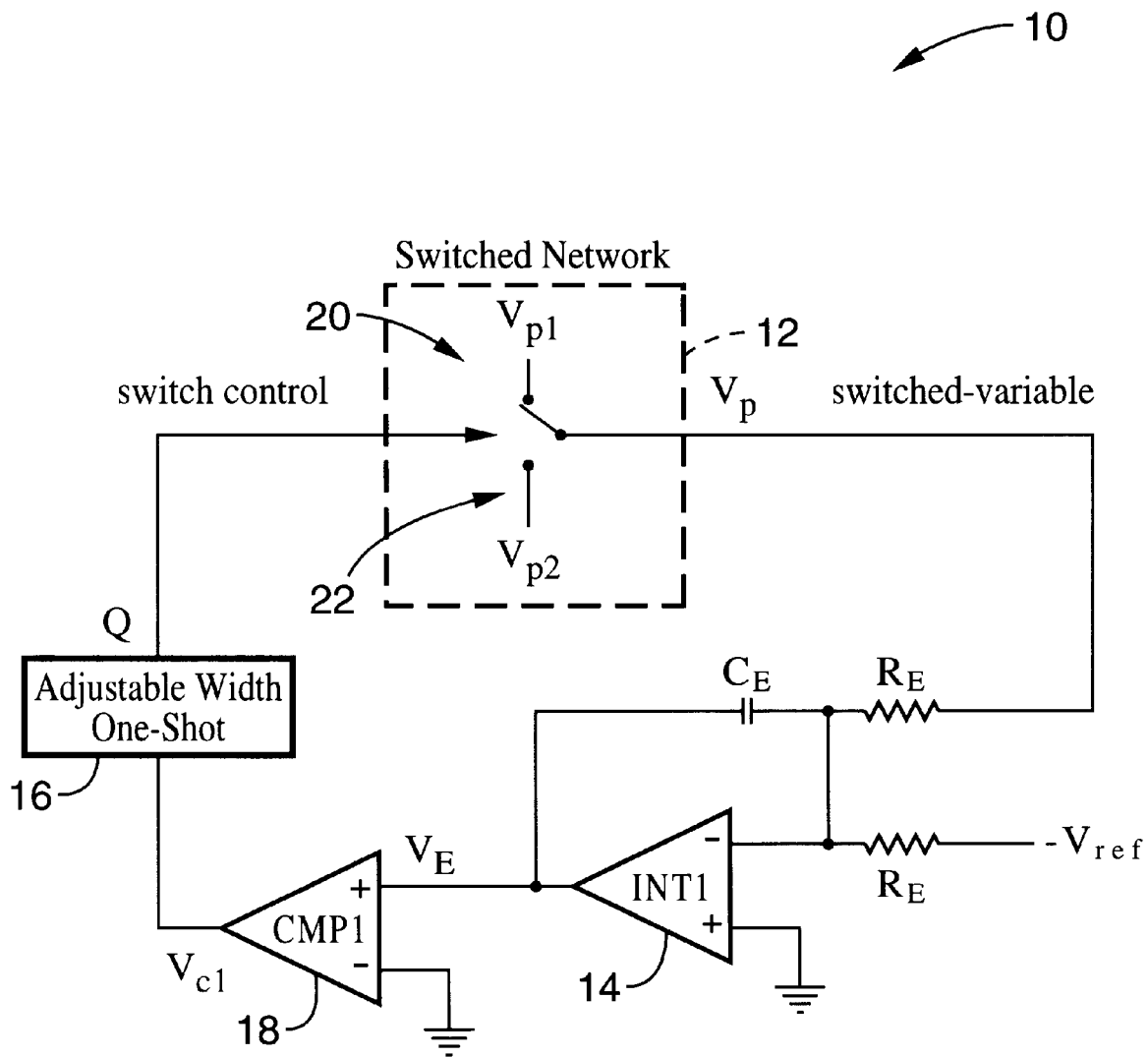
FIG. 1 is a functional block diagram of a PWM controller with one cycle response in accordance with the present invention.
Figure 2:
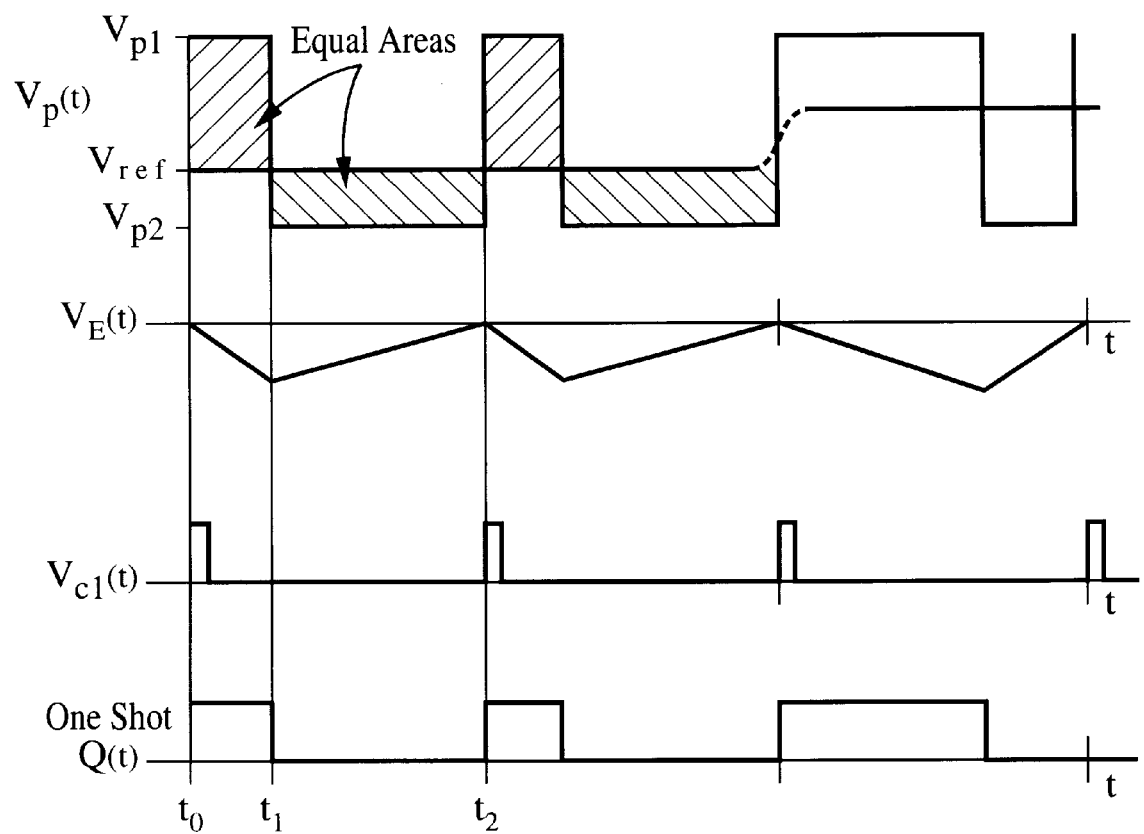
FIG. 2 is a timing diagram for the PWM controller shown in FIG. 1.

The control method and apparatus 10 of the present invention can be seen with reference to the functional block diagram shown in FIG. 1 and the waveforms shown in FIG. 2. The switched network 12 represents any system where a switched-variable $V_p$ is to be controlled. For example, the switched-variable of a buck converter can be the diode voltage which is controlled by turning on or off the main switch. The one cycle response of the system is ensured by forcing the local average (average over one switching cycle) of the switched-variable, $<V_p>$, to exactly equal $V_{ref}$ each switching cycle. The width of an adjustable width one-shot 16 is adjusted each cycle to achieve constant switching frequency. A switching cycle starts at $t_0$ with the one-shot 16 being triggered by a pulse from a comparator 18 (CMP1). This forces $V_p$ to equal the upper rail 20 ($V_{p1}$) and the error integrator 14 (INT1) will integrate the difference between $V_{p1}$ and $V_{ref}$ until the end of the one shot pulse at $t_1$. The switch then changes its state and causes $V_p$ to equal the lower rail 22 ($V_{p2}$) and the error integrator 14 will integrate the difference between $V_{p2}$ and $V_{ref}$ until the error equals zero at $t_2$, assuming $V_{p1}>V_{p2}$. Then comparator 18 triggers another one shot and the next cycle is started. Note in FIG. 2 that the cross-hatched areas are equal, showing that the local average $<V_p>$ exactly equals $V_{ref}$ at the end of the switching cycle and one cycle response results. The switching frequency is held approximately constant by adjusting the width of the one-shot pulse to account for changes in $V_{p1}$, $V_{p2}$, and $V_{ref}$.

Figure 3:
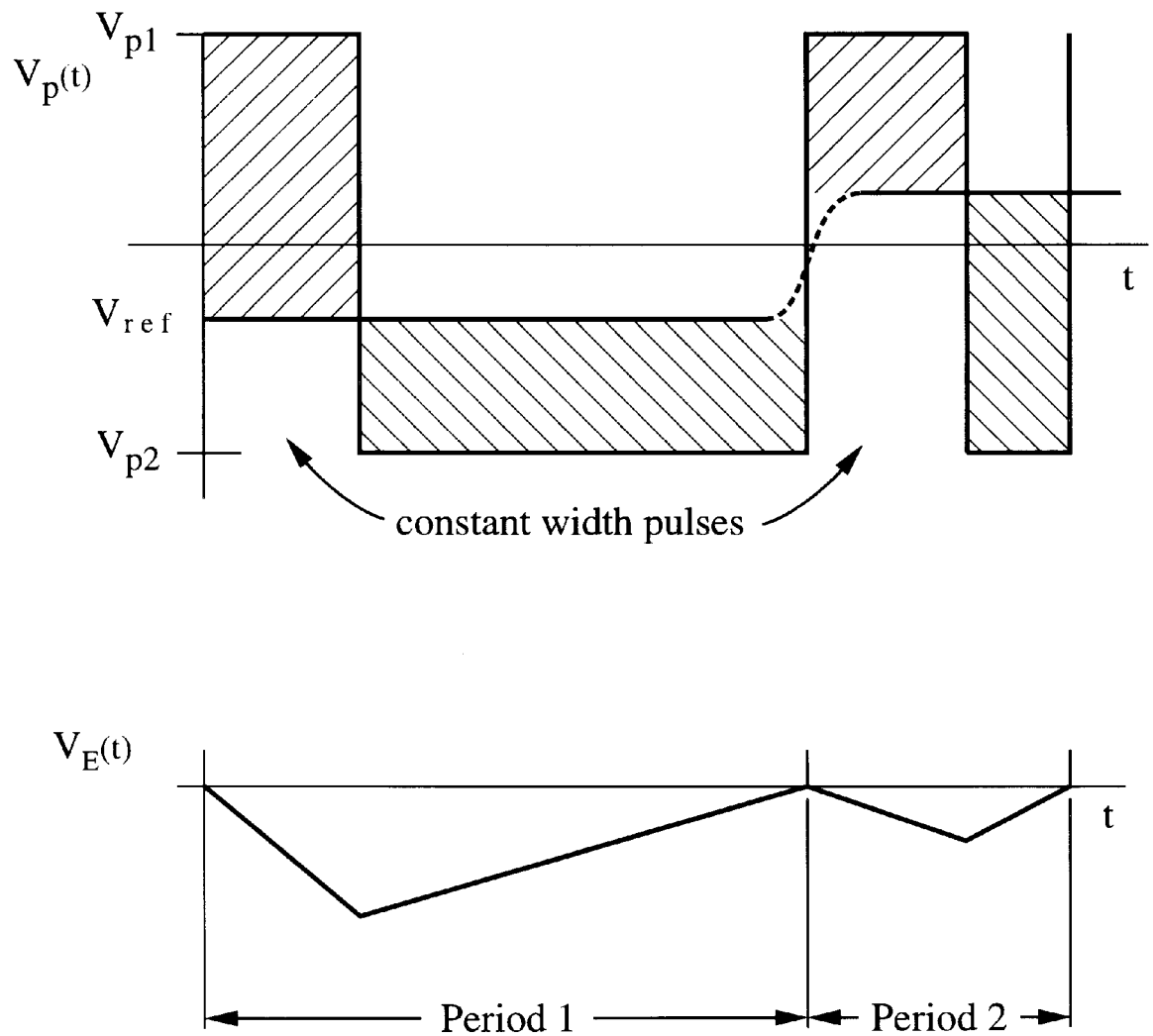
FIG. 3 is a timing diagram showing a constant one-shot pulse width.

FIG. 3 demonstrates the need to adjust this pulse width. Note that in FIG. 3, $V_{ref}$ increases in the second switching cycle while the one shot pulse width (time when $V_p=V_{p1}$) remains constant. Because integrator 14 forces a balanced alternating current (AC) waveform, this dramatically decreases the second switching period. Similar problems occur if the $V_{p1}$ or $V_{p2}$ has variations.

The required pulse width to maintain constant switching frequency for any $V_{p1}$, $V_{p2}$, and $V_{ref}$ can be found by examining the error integrator operation equation:

$$\frac{1}{T_E}\int_{t_0}^{t_1}(V_{p1}-V_{ref})dt + \frac{1}{T_E}\int_{t_1}^{T_s}(V_{p2}-V_{ref})dt = 0 \qquad (1)$$

where $T_E=R_E C_E$ as shown in FIG. 1 and $T_S=t_2-t_0$ is the switching period. The first term describes the error integrator operation when $V_p=V_{p1}$ and the second term describes the operation when $V_p=V_{p2}$. If $T_s$ is assumed to be constant, the one-shot on time ($t_{one}=t_1-t_0$) should satisfy the following:

$$t_{one} = \left(\frac{V_{ref}-V_{p2}}{V_{p1}-V_{p2}}\right)T_s \qquad (2)$$

Rearranging equation (2) puts it into a form that can be realized with a resettable integrator and comparator circuit:

$$\frac{1}{T_0}\int_0^{t_{one}}(V_{p1}-V_{p2})dt = V_{ref}-V_{p2} \qquad (3)$$

Where $T_0$ equals $T_s$.

Figure 4:
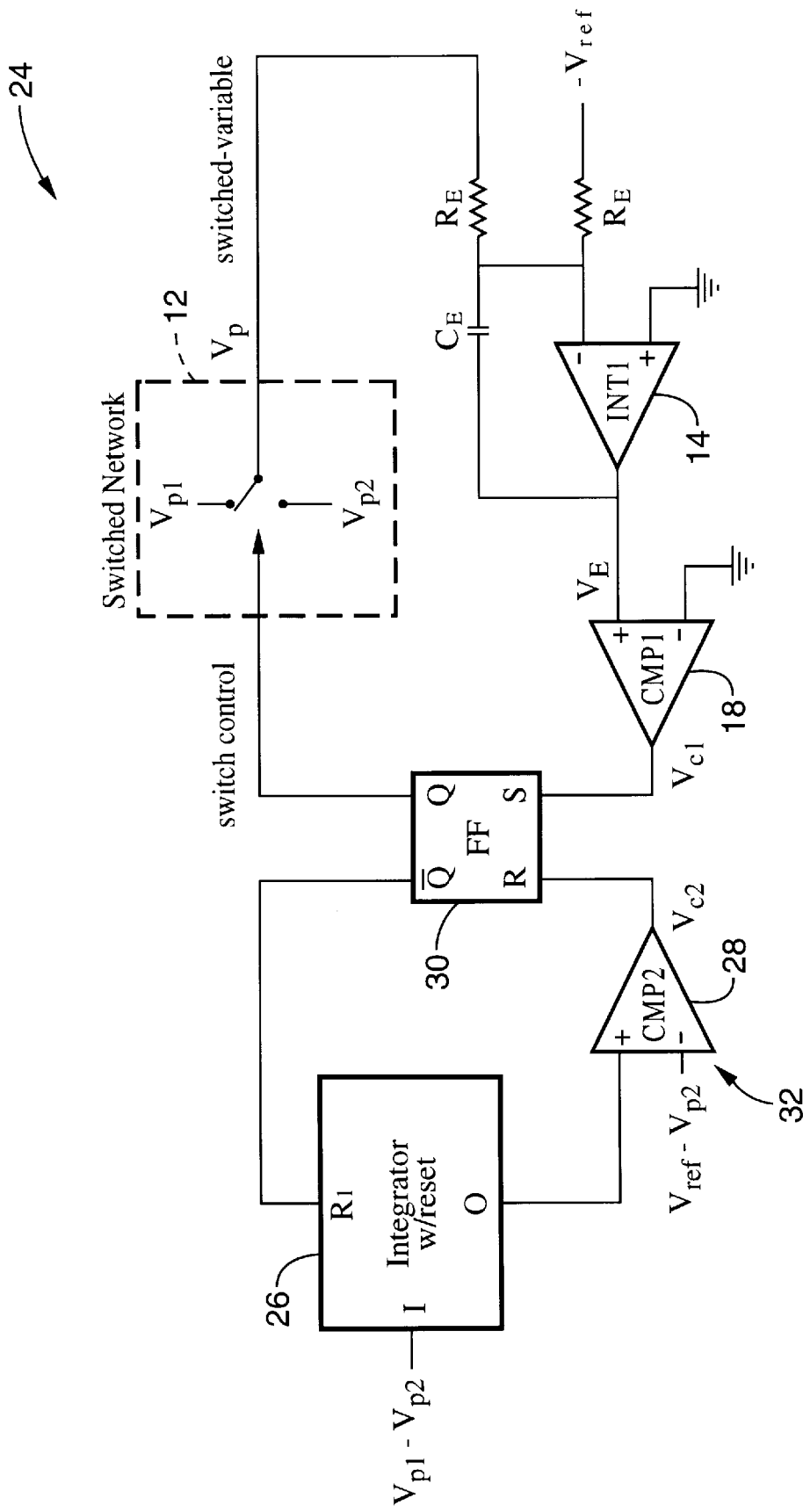
FIG. 4 is a functional block diagram of a second embodiment of the PWM controller in accordance with the present invention.

A functional block diagram of a PWM controller 24 showing the details of the adjustable one shot control can be seen in FIG. 4. The integrator w/reset block 26 is a normal integrator with input I and output O when Ri is low. Otherwise the output is reset to zero when Ri is high. During a one-shot period the Ri input is low and the integrator integrates the I input until it satisfies equation (2). The comparator 28 (CMP2) then goes high resetting the flip flop 30 (FF) which changes the state of $V_p$ and resets the integrator 26 until the flip-flop 30 is set by comparator 18 at the beginning of the next cycle.

The control circuit has been defined for any switched network where a switched-variable is to be controlled. The control method monitors the error integrator 14 to ensure one cycle response without a resettable integrator in the control path. With this circuit, there will be no reset transient when the integrator 14 is not integrating error. A resettable integrator 26 is used to control the one-shot pulse width to obtain nearly constant switching frequency. However, because it does not have to be reset instantaneously (only before the start of the next cycle), the reset circuit speed does not have to be very fast. For the trailing-edge modulation shown in FIG. 2, the fastest reset time is needed when $V_{ref}$ approaches $V_{p1}$. If the reset time is too slow, it will limit the maximum duty ratio, suggesting a design tradeoff criteria. Table 1 gives some examples of the switched-variable and $t_{one}$ values for some commonly used amplifier topologies where $V_g$, $V_{g1}$, $V_{g2}$ are power supply voltages.

Leading, Trailing, and Double Edge Modulation

Figure 5:
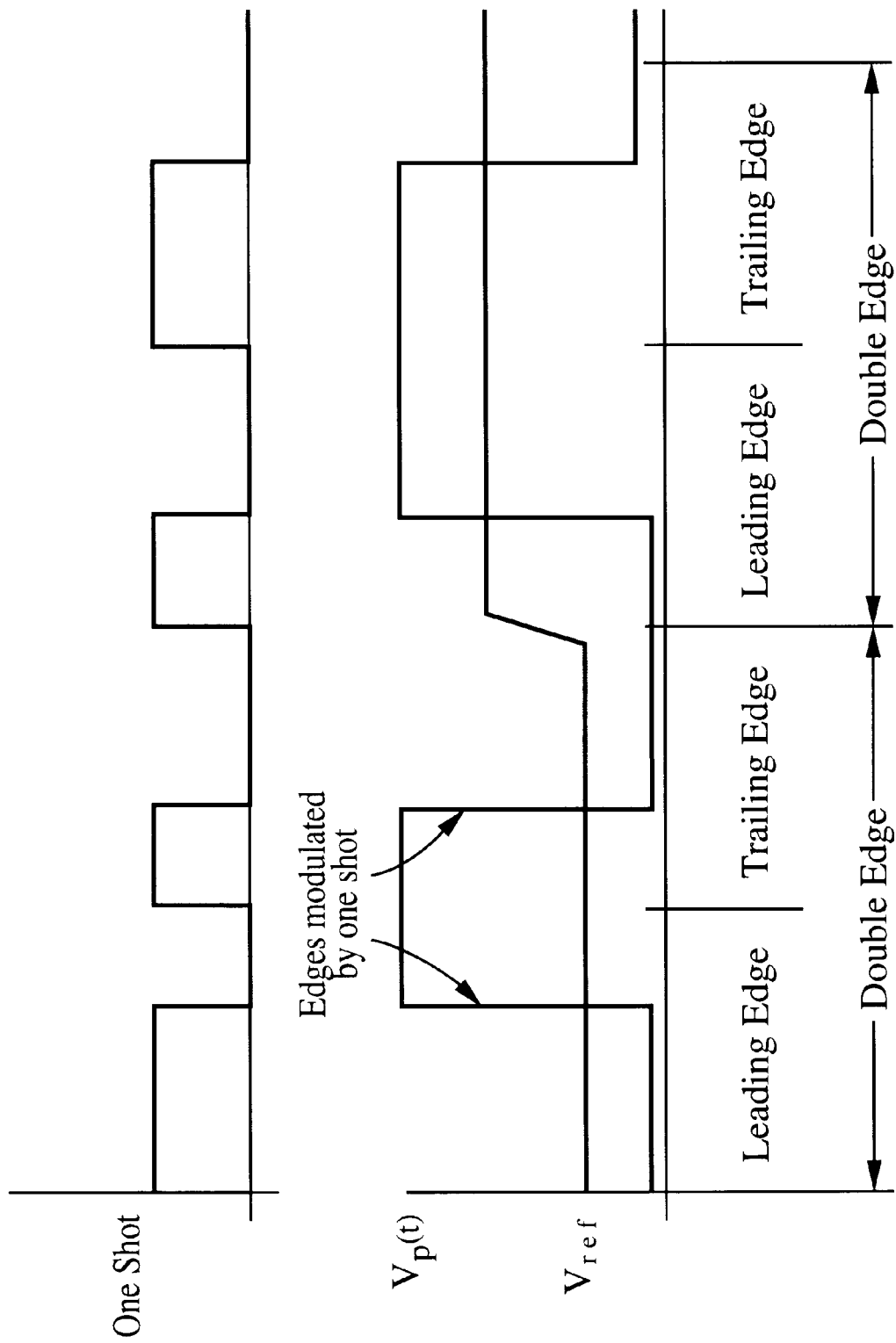
FIG. 5 is a timing diagram showing double edge modulation.

The present invention can be implemented with leading, trailing, and double-edge modulation. Notice that the term leading-edge, trailing edge, and double edge are not identical to the traditionally used ones. Traditionally, the terms leading, trailing, and double-edge modulation apply to constant frequency PWM methods. Because the frequency is constant, one of the edges or the center of the pulse is fixed while the other edge or both edges are modulated, where the modulation tries to force the local average of the pulse to equal the reference signal. The new control method only modulates the pulse width to achieve constant switching frequency. The one cycle response is determined by the error integrator equaling zero at the end of the cycle. Therefore the edge modulation only indirectly controls the local average of the pulse. With these observation, for the new control method, the terms leading, trailing, and double-edge modulation apply to the edge of the PWM pulse that is modulated by the one-shot. FIG. 5 shows how double-edge modulation can be implemented by combining leading and trailing-edge modulation on alternate half-cycles.

II. Switching Frequency Variations

The description of the invention in Section I assumed that $V_{p1}$, $V_{p2}$ and Vref are approximately constant during one switching cycle. However, if these values are changing substantially during a switching cycle, the switching frequency, $f_s$, will be affected. Additionally, the derivation also assumed that the circuit delays are zero. These delays, inherent in any circuit, can also affect the switching frequency. This section shows how the switching frequency is affected by the variations in $V_{p1}$, $V_{p2}$ and $V_{ref}$ and non-zero delays in the circuit. The exact switching period is found by rewriting equation (2) and equation (1) with $V_{p1}$, $V_{p2}$, and $V_{ref}$ as function of time:

$$\frac{1}{T_0}\int_0^{t_{one}} (V_{p1}(t) - V_{p2}(t))dt = V_{ref}(t_{one}) - V_{p2}(t_{one}) \tag{3}$$

$$\int_0^{t_{one}} (V_{p1}(t) - V_{ref}(t))dt + \int_{t_{one}}^{T_s} (V_{p2}(t) - V_{ref}(t))dt = 0 \tag{4}$$

$T_s$ is found from equation (4) after solving for $t_{one}$ in equation (3). For double-edge modulation each half cycle period (trailing and leading-edge) is solved for and then added to obtain the complete period.

For time-variant functions of $V_{p1}(t)$, $V_{p2}(t)$, and $V_{ref}(t)$, a closed form solution is not possible. Therefore, a computer was used to calculate the switching frequency fluctuations for a trailing and double-edge full bridge converter with sinusoidal ripple in the power supply, $V_g(t)$, and a sinusoidal reference signal, $V_{ref}(t)$. Leading-edge modulation has symmetrical results compared to trailing-edge modulation and therefore is not included.

A. $V_g$ Induced $f_s$ Variation

Fluctuation of the switching frequency with a constant reference signal and a changing power supply were analyzed by assuming the supply voltage equaled the following:

$$V_g(t)=1+0.2 \sin(\omega_g t+\Phi) \tag{5}$$

Figure 6:
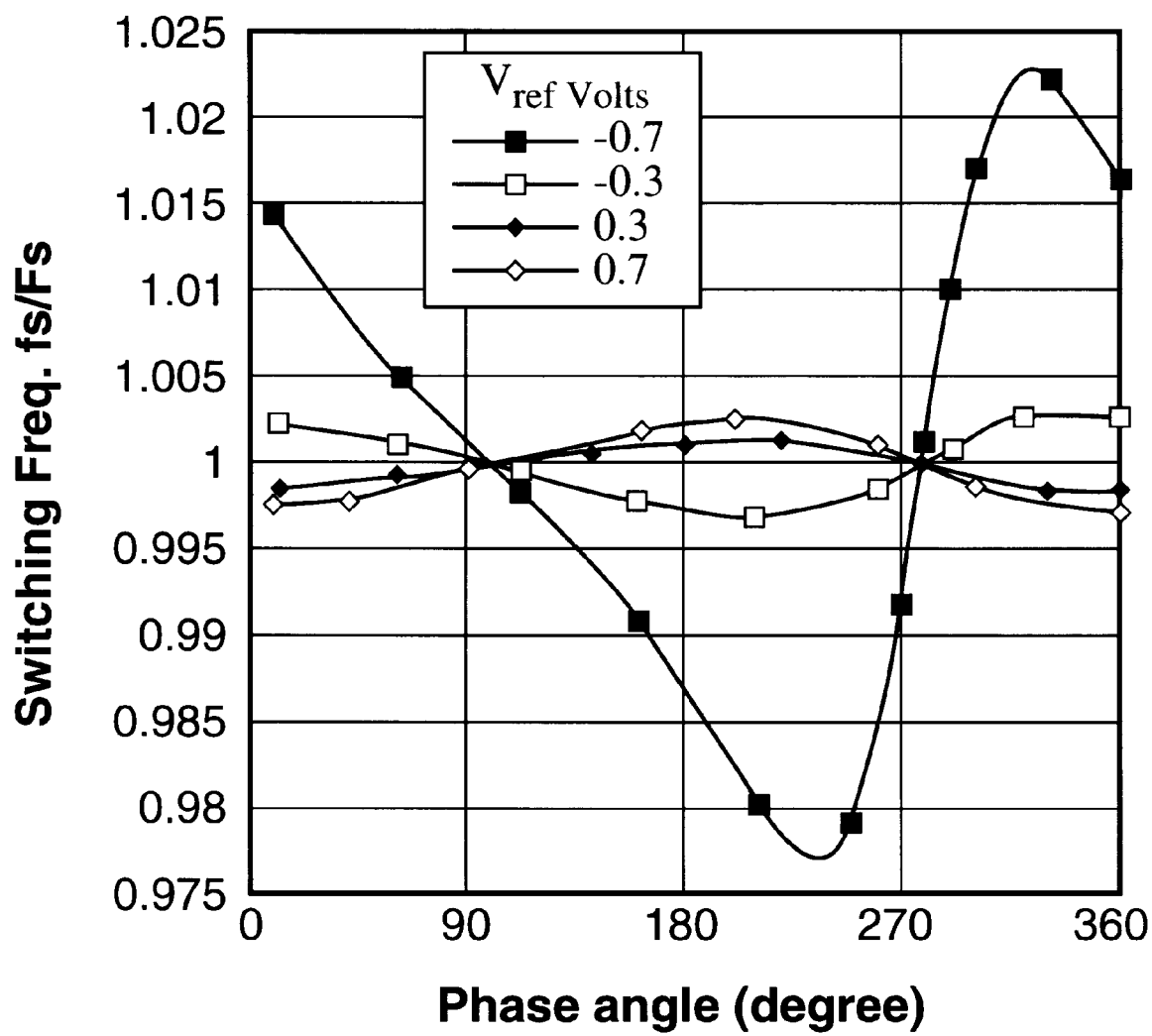
FIG. 6 is a graph showing $f_s$ variation caused by supply ripple vs. $\phi$ for trailing-edge modulation when $F_s/f_g=100$.
Figure 7:
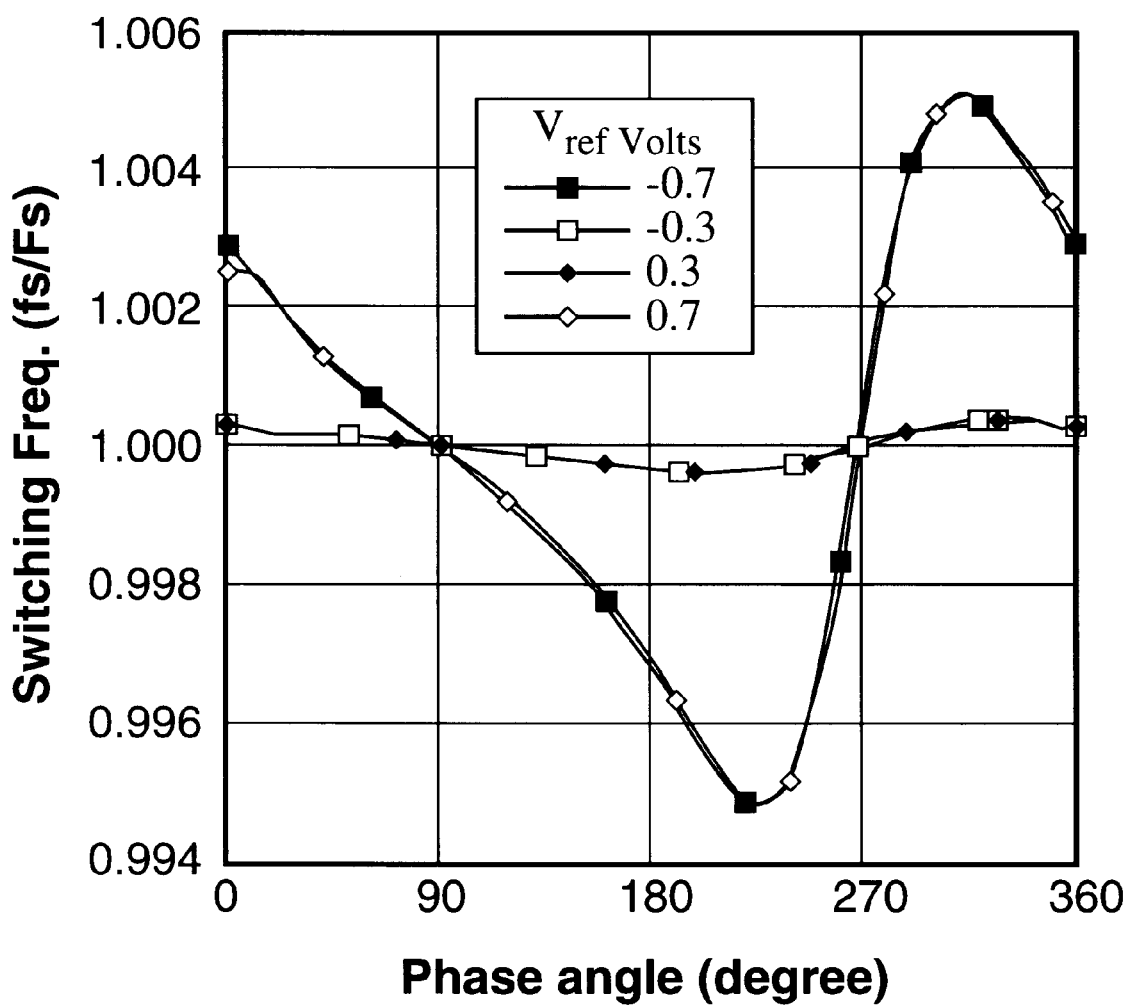
FIG. 7 is a graph showing $f_s$ variation caused by supply ripple vs. $\phi$ for double-edge modulation when $F_s/f_g=100$.
Figure 8:
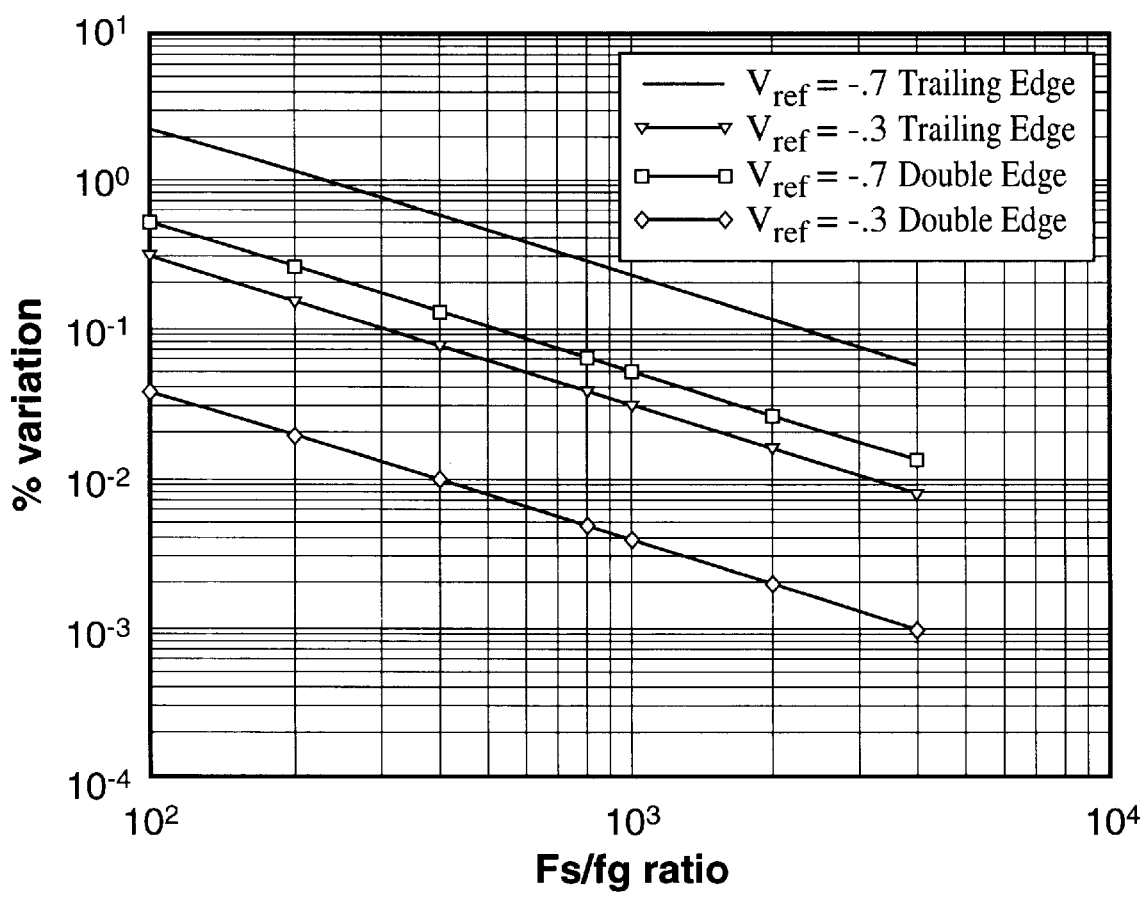
FIG. 8 is a graph showing the maximum $f_s$ variation for different $F_s/f_g$ ratios.

This represents a 40% power supply ripple about the DC value. When using equation (5) with equation (3) and equation (4), the phase angle $\phi$ is set to represents the initial state of the power supply signal at the start of the switching cycle, $V_g(0)$. $T_s$ was numerically solved for different values of $\omega_g$, and $V_{ref}$, while $\phi$ is swept over a complete cycle (360 degrees). The switching frequency variation in a complete power supply ripple cycle are shown in FIG. 6 for the trailing-edge modulation and FIG. 7 for the double-edge modulation, respectively. $F_s$ represents the nominal switching frequency when both $V_{ref}$ and $V_g$ are constant. For both FIG. 6 and FIG. 7 the nominal switching frequency $F_s$ is 100 times greater than $f_g=\omega_g/2\pi$. Even at this large 40% power supply ripple, the switching frequency fluctuation is only ±2.25% and ±0.50% of the nominal value for trailing-edge and double-edge modulation respectively. FIG. 8 shows the maximum percent variation of $f_s$ over a complete cycle for both trailing and double-edge modulation while $F_s/f_g$ is changed. In 20 kHz bandwidth audio amplifier applications, the fundamental of the power supply ripple (120 Hz) will be more than 2000 times smaller than the switching frequency (>250 kHz). Therefore, the approximation of constant switching frequency with respect to a power supply ripple is well within reason.

B. $V_{ref}$ Induced $f_s$ Variation

Variations in the switching frequency with a constant power supply ($V_g$=1) and a changing reference signal were determined assuming that the reference signal equaled the following:

$$V_{ref}(t)=A \sin(\omega_{ref} t+\Phi) \tag{6}$$

Figure 9:
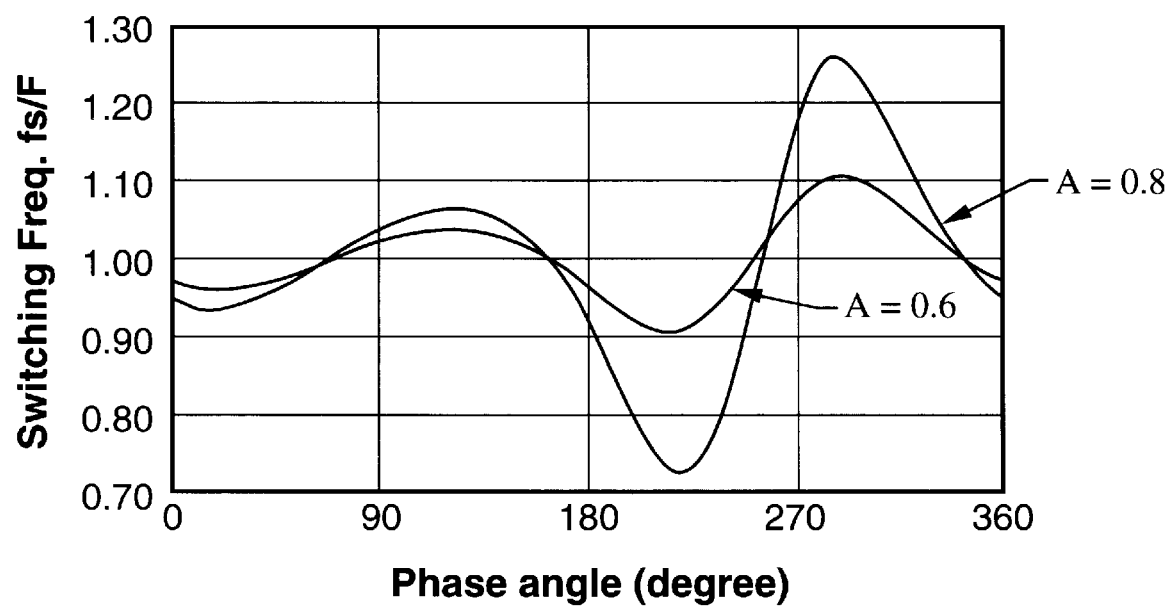
FIG. 9 is a graph showing the $f_s$ variation caused by $V_{ref}$ vs. $\phi$ for trailing-edge modulation when $F_s/f_{ref}=10$.
Figure 10:
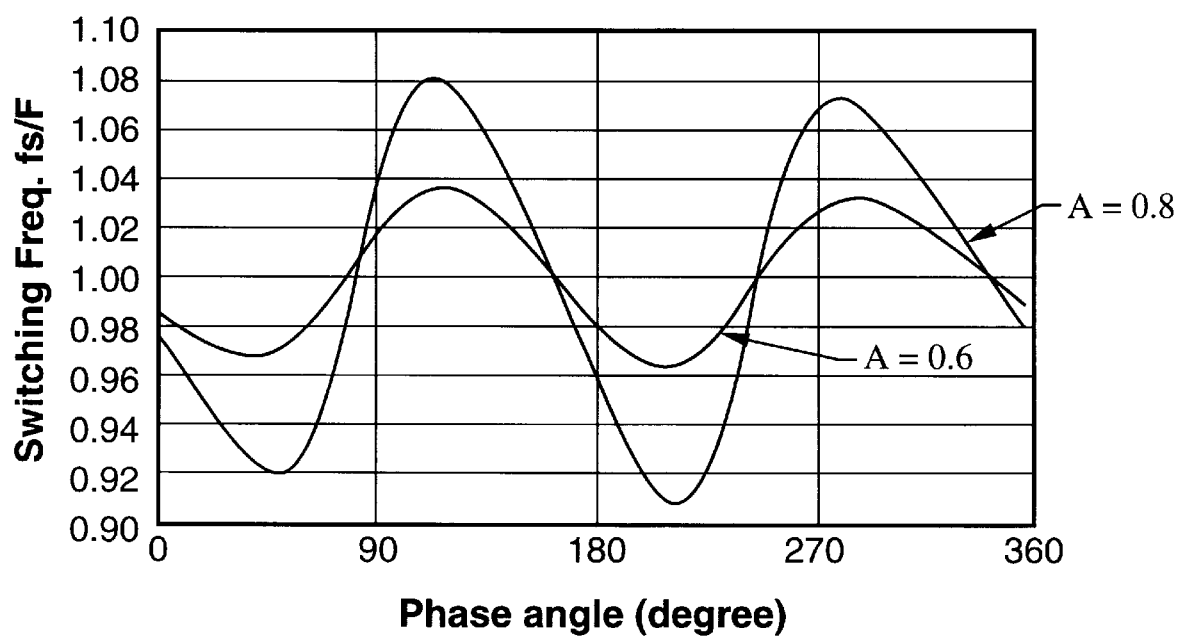
FIG. 10 is a graph showing $f_s$ variation caused by $V_{ref}$ vs. $\phi$ for double-edge modulation when $F_s/f_{ref}=10$.
Figure 11:
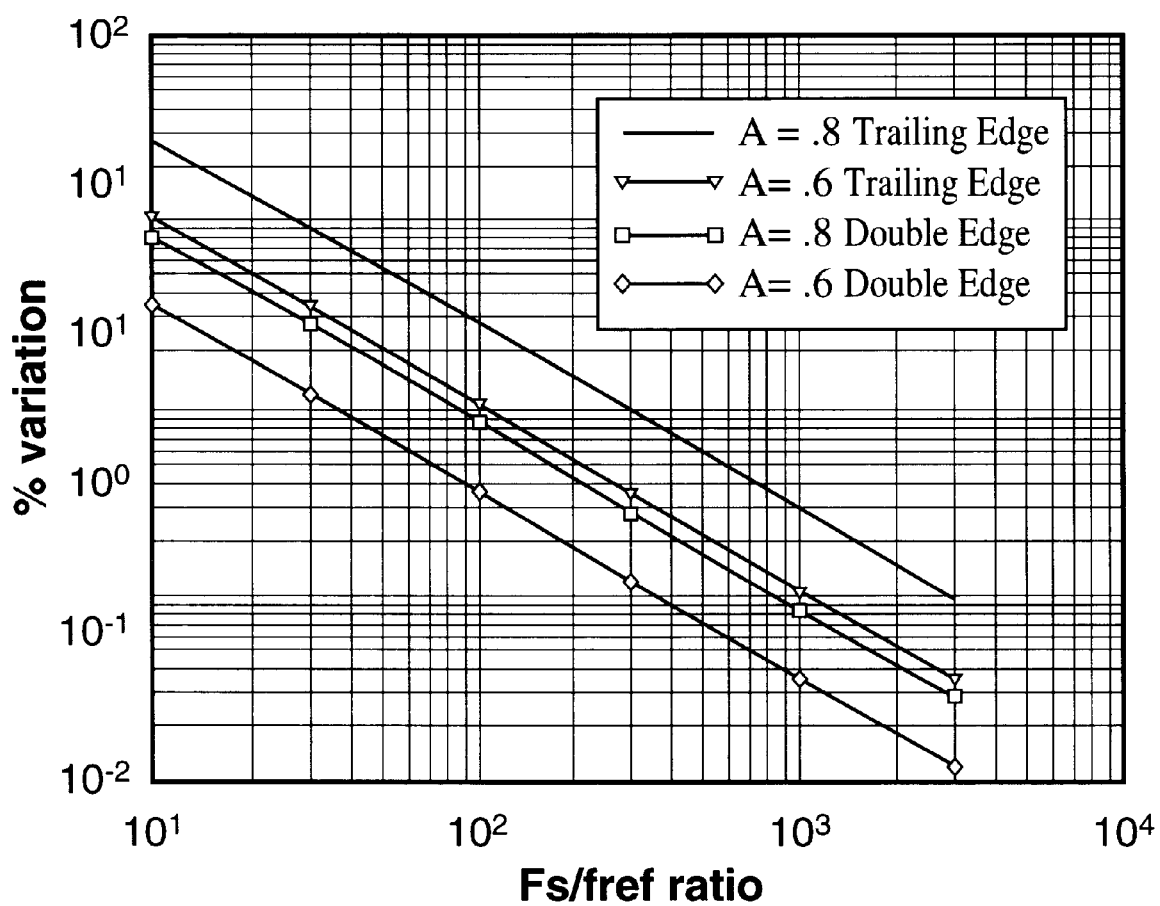
FIG. 11 is a graph showing the maximum $f_s$ variation for different $F_s/f_{ref}$ ratios.

As with equation (5), when using equation (6) with equation (3) and equation (4), the phase angle $\phi$ is set to represents the initial state of the reference signal at the start of the switching cycle, $V_{ref}(0)$. Ts was numerically solved for different values of $\omega_g$, and A, while $\phi$ is swept over a complete cycle (360 degrees). The calculated frequency variations over a complete signal cycle are shown in FIG. 9 for trailing-edge modulation and FIG. 10 for double-edge modulation respectively. For both FIG. 9 and FIG. 10 the nominal switching frequency, Fs is ten times greater than fref=$\omega_{ref}/2\pi$. Double-edge modulation shows much less fs variation, ±8%, compared to trailing-edge modulation ±27%. FIG. 11 shows the maximum $f_s$ variation over a complete signal frequency for different ratios of $F_s/f_{ref}$. Once again the double-edge modulation shows less variation than trailing-edge modulation. Additionally, the amount of variation drops with lower Vref peak amplitudes (A) and higher $F_s/f_{ref}$ ratios.

C. Control Delay Induced $f_s$ Variation

Figure 12:
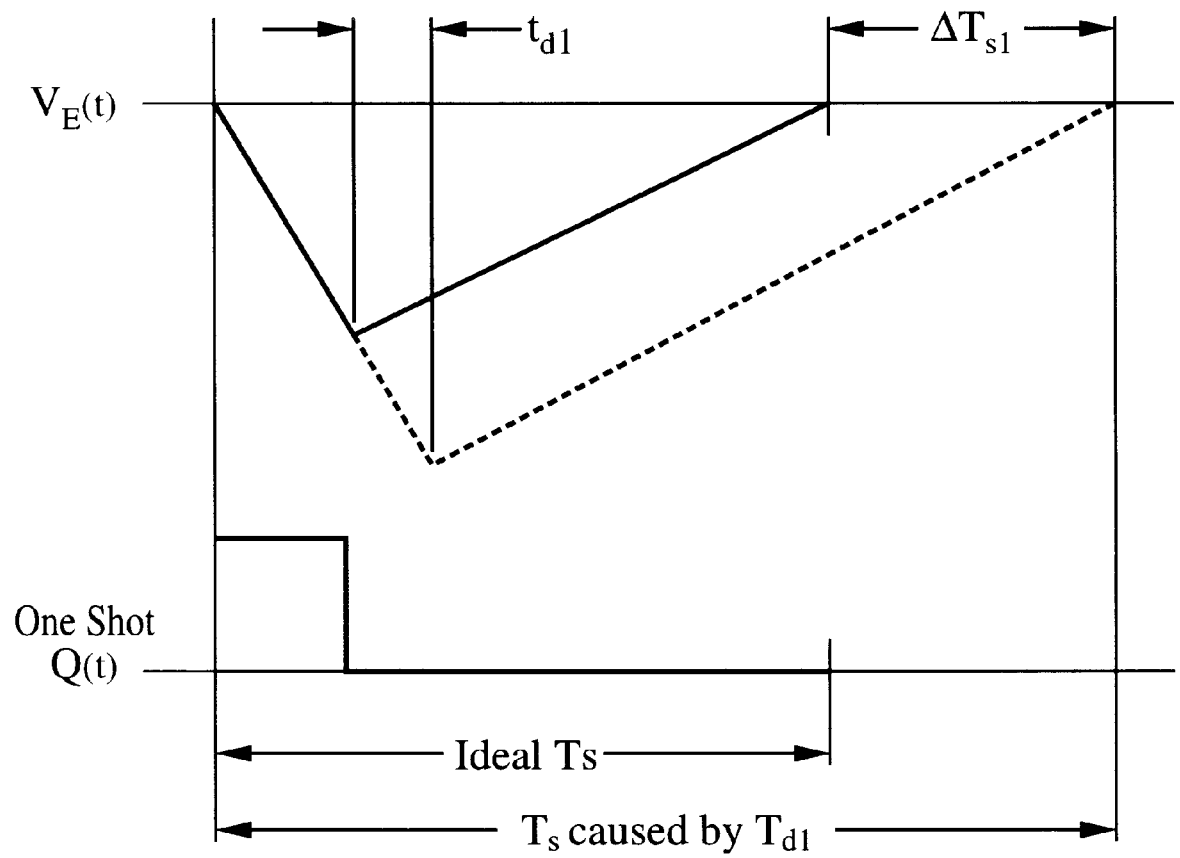
FIG. 12 is a timing diagram showing $t_{d1}$ induced $f_s$ variation.

There are three inherent delays in the circuit that can cause significant switching frequency variation unless corrected for. The first delay, $t_{d1}$, is defined as the delay from the completion of the one shot pulse and the reset of the flip-flop 30 to the change in $V_p$ to $V_{p2}$. The second delay, $t_{d2}$, is the delay from the error integrator 14 equaling zero and setting the flip-flop 30 to the change in $V_p$ to $V_{p1}$. The third delay, $t_{d3}$, is the error integrator equaling 14 zero and setting the flip-flop 30 to the start of the resettable integrator 26. FIG. 12 shows how $t_{d1}$ can cause variation is switching frequency. As shown in FIG. 12, although the one shot has finished its pulse, the output variable does not change until a small delay later. Moreover, as shown in the diagram, this small delay can be amplified to cause a much larger switching frequency variation. The added period caused by $t_{d1}$ is dependent on the slopes of the integrator output as shown in below:

$$\Delta T_{s1} = t_{d1} \left( \frac{V_{p2} - V_{p1}}{V_{p2} - V_{ref}} \right) \tag{7}$$

As shown in equation (7), when $V_{ref} \rightarrow V_{p2}$, $\Delta T_{s1} \rightarrow \infty$.

To compensate for this delay, a linear extrapolator was added to the resettable integrator circuitry. This extrapolator ends the one shot period $t_{d1}$ before the end, therefore effectively limiting the delay. It does this by using the slope of integrator output and multiplies that by $t_{d1}$ before subtracting it from the comparator 28 negative input 32. Conveniently, the slope of the integrators output is proportional to its input and therefore the resettable integrator circuit equation (2) is modified slightly below:

$$\frac{1}{T_0} \int_0^{t_{one}} (V_{p1} - V_{p2}) dt = V_{ref} - V_{p2} - t_{d1} \frac{V_{p1} - V_{p2}}{T_0} \tag{8}$$

There are several ways to include the extrapolator in the circuit. If the adder is a typical op-amp adder circuit, one additional resistor is needed for the extrapolator. Another simple way is to add a resistor in series with the integration capacitor as was done in the experimental circuit described later.

Figure 13:
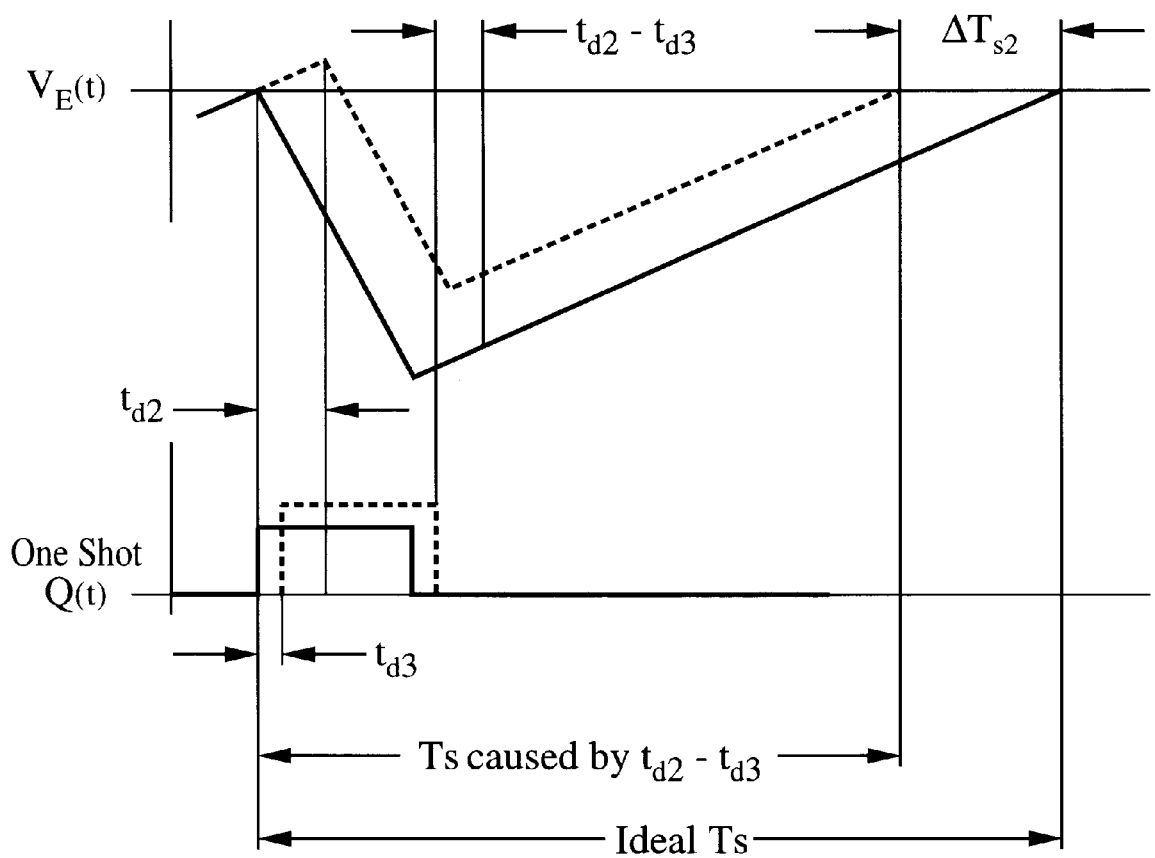
FIG. 13 is a timing diagram showing $t_{d2}$ and $td_3$ induced $f_s$ variation.

FIG. 13 shows how $t_{d2}$ and $t_{d3}$ can effect the switching frequency. The added period caused by the delays is proportional to the difference in the delays ($t_{d3} - t_{d2}$). This difference in delays can be thought of as causing the one-shot to turn off before it should. This difference then can cause a substantial decrease in the switching period as given by the following equation:

$$\Delta T_{s2} = (t_{d3} - t_{d2}) \left( \frac{V_{p2} - V_{p1}}{V_{p2} - V_{ref}} \right). \tag{9}$$

Although equation (9) shows that when $V_{ref} \rightarrow V_{p2}$, $\Delta T_{s2} \rightarrow \infty$, if $t_{d3}$ and $t_{d2}$ are made equal then the variation will be neglected. Since $t_{d3}$ will most often be smaller than $t_{d2}$, it is very easy to put in a small delay into the circuit to completely eliminate this variation. Another solution is to make this delay difference equal to the delay described in equation (7) ($t_{d1} = t_{d3} - t_{d2}$). However, this would need $t_{d2}$ to be made larger adding additional error to the one cycle response.

III. Experimental Circuit and Test Results

A. Single-edge vs. Double-edge Modulation

For DC-AC amplifier applications, constant frequency one cycle control leading or trailing-edge (single-edge) modulation contains signal distortion because of pulse-position-modulation caused by the reference signal and power supply ripple changes. The new control method will not have exactly constant switching frequency when either $V_{ref}$ or the switching variable values $V_{p1}$ and $V_{p2}$ are changing. Although this fluctuation is small, because it is added to the pulse position modulation effect, single-edge modulation produces too much signal distortion for high fidelity audio applications with a reasonable switching speed. However, double-edge modulation eliminates the pulse position modulation and reduces switching frequency variations as shown in Section II. Therefore, the experimental circuit incorporated double-edge modulation.

B. Experimental Circuit

Figure 14:
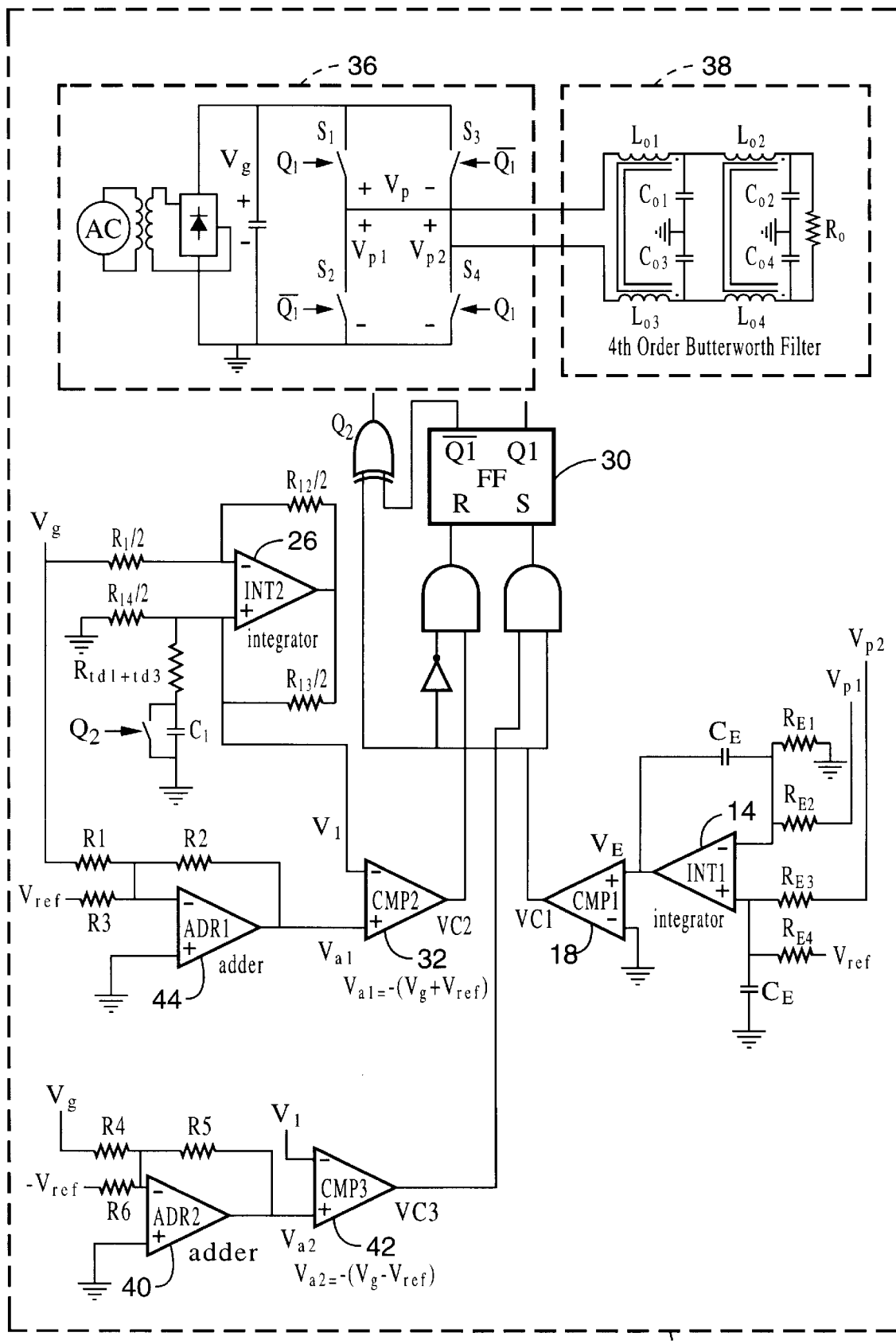
FIG. 14 is a schematic diagram showing a double-edge modulated implementation of the present invention.
Figure 15:
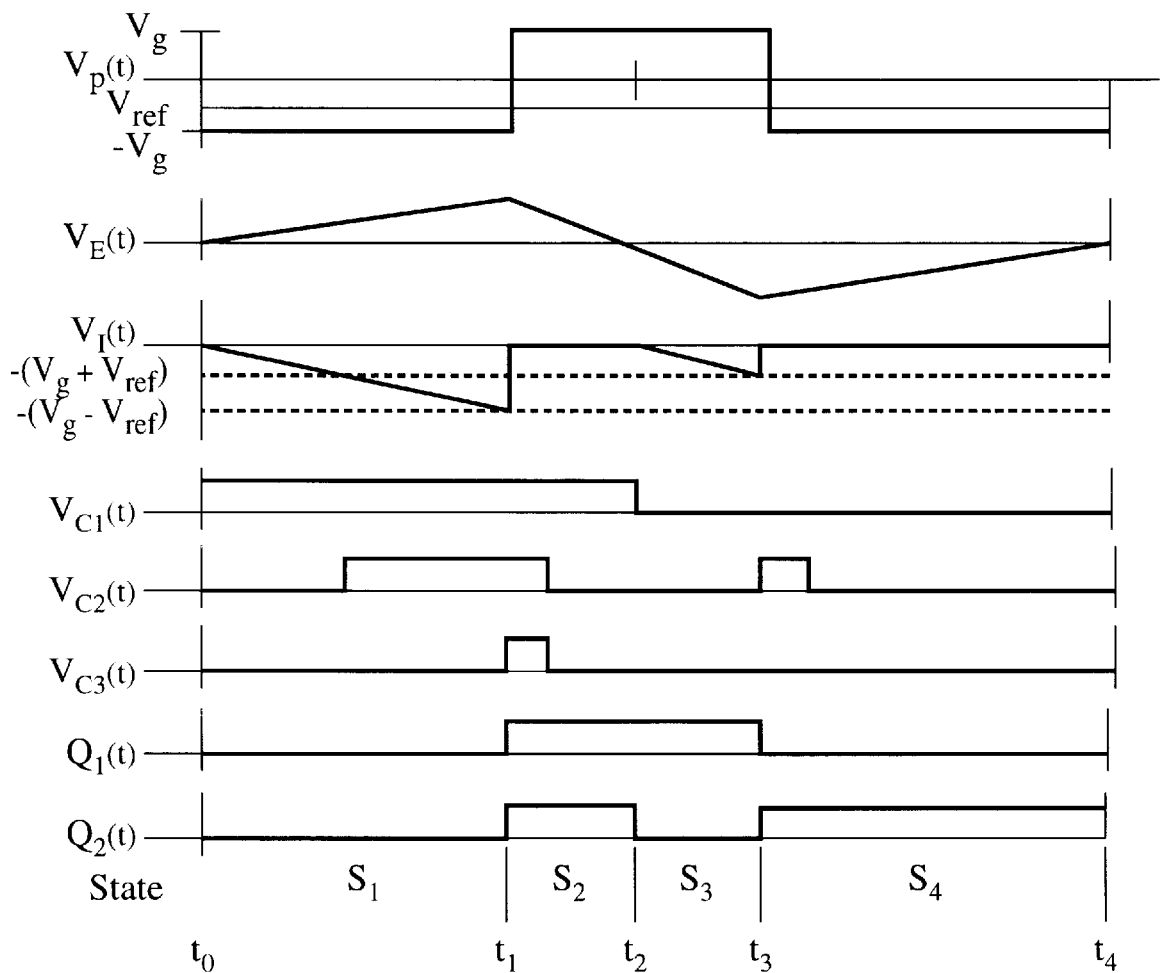
FIG. 15 is a timing diagram showing theoretical waveforms for the implementation shown in FIG. 14.

A 95-watt RMS, 0–20 kHz bandwidth audio amplifier was built to prove the theoretical expectation of the control method performance. FIG. 14 provides an example of an implementation for a full bridge DC-AC power amplifier 34 and FIG. 15 shows the theoretical waveforms. The power supply 36 for the bus voltage, $V_g$, is a bridge rectifier from the AC mains and was used for all experiments except for the ripple rejection vs. frequency test where a swept sinusoidal source is required. The average $V_g$ voltage is fifty-four volts at full output power. The nominal switching frequency is 250 kHz and the load, Ro, is an eight ohm resistor. The output filter 38 is a differential mode 4th order Butterworth filter. The inductors are coupled as shown to reduce magnetic material and ease inductor matching. The circuit uses double-edge modulation because of its improved performance, and was built with only a few additional parts compared to the signal-edge modulator implementation. This implementation uses one additional summer 40 (ADR2) comparator 42 (CMP3), and a few logic gates to implement the double-edge modulation. Integrator 14 and comparator 18 integrate the error signal and ensure that the error is zero when the switching cycle ends. The resettable integrator 26 (INT2), with adder 44 (ADR1) and comparator 42 (CMP3) determine the leading-edge off-pulse width. In addition, this integrator with adder 40 (ADR2) and comparator 32 determine the trailing-edge off-pulse width. The experimental circuit is shown in FIG. 14 with the resistor values scaled so that the amplifier gain is twenty-four, but any gain is possible (e.g., when R1=R2=R3=R4=R5=R6; RI1=RI2=RI3=RI4; RE1=RE2=RE3=RE4, then the amplifier gain is 1). Since $V_p$ is a differential voltage, integrator 14 is implemented using a simple single op-amp differential with an additional input for $V_{ref}$. Integrator 26 is implemented using a Howland current because the capacitor is grounded and easier to reset. Integrator 26 is reset using an analog switch, such as an 74HC4052 or the like. The logic circuitry along with the output of $V_{c1}$ realize a four state state-machine to alternately perform leading and trailing-edge modulation on alternate half cycles. Table 2 describes and gives the output values for these states. Resistor $R_{td1} + t_{d3}$ is the linear estimator that compensates for the $t_{d1}$ and $t_{d3}$ delays in the circuit as described by equation (8).

$$R_{td1+td3} = \frac{t_{d1} + t_{d3}}{C_I} \tag{10}$$

For double sided modulation, delay $t_{d2}$ does not exist. When the gain is set to one (i.e., $R_I = R_{I1} = R_{I2} = R_{I3} = R_{I4}$) then the switching frequency is set to 250 kHz by $R_I$ and $C_I$.

$$R_I C_I = \frac{T_s}{2} = T_0 \tag{11}$$

$R_I C_I$ are set to half the switching period because both leading and trailing are performed each cycle.

At time $t_0$ the one shot is triggered to start a leading-edge modulated half cycle with the state machine in state $S_I$ and $V_p = -V_g$. When the one shot integrator equals $-(V_g - V_{ref})$ at $t_1$, comparator 42 goes high and triggers the state machine to the next state (comparator 32 has no effect on the circuit during this state). Now, $V_p = V_g$ and the error integrator, $V_E$, integrates until it reaches zero at t2 and comparator 18 becomes zero. Then the one shot is started again and for this half cycle the operation is a trailing-edge PWM modulator. When the one shot integrator equals $-(V_g + V_{ref})$ at $t_3$ comparator 32 goes high and triggers the state machine to $S_4$. $V_p$ becomes $-V_g$ again and the error integrator integrates until it reaches zero at $t_4$ and the operation is repeated cycle by cycle.

Figure 16:
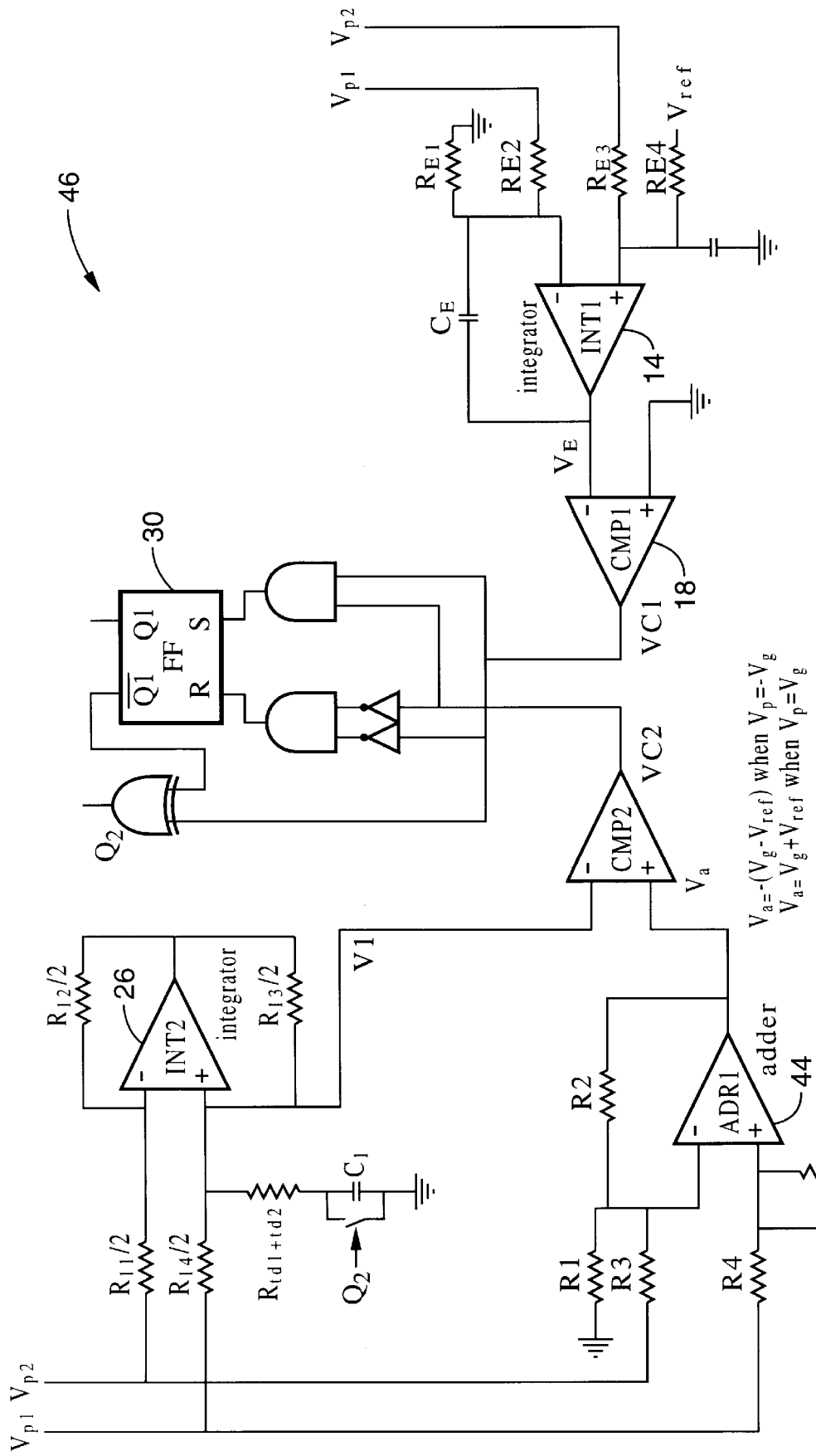
FIG. 16 is a schematic diagram showing an alternative double-edge modulation control implementation in accordance with the present invention.

FIG. 16 shows an even simpler version 46 of the double-edge modulation control circuit shown in FIG. 14. The adder (ADR2) and comparator (CMP3) are removed and the $V_g$ sensor is replaced by $V_p$. The logic circuitry also is changed. This circuit uses less components, but requires a faster adder 44 (i.e. fast op-amp settling time) than the one used in the experiments.

C. Power Supply Ripple Rejection (SRR)

Figure 17:
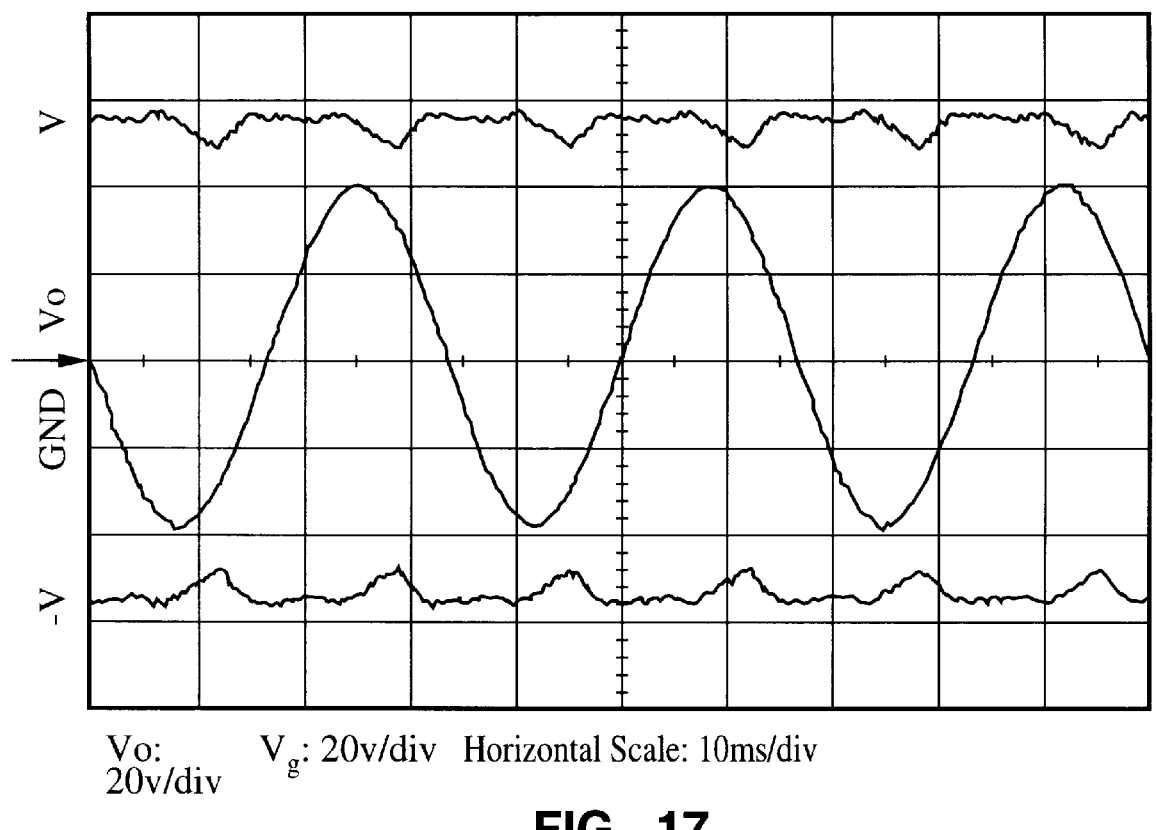
FIG. 17 is a plot showing the time domain ripple rejection.
Figure 18:
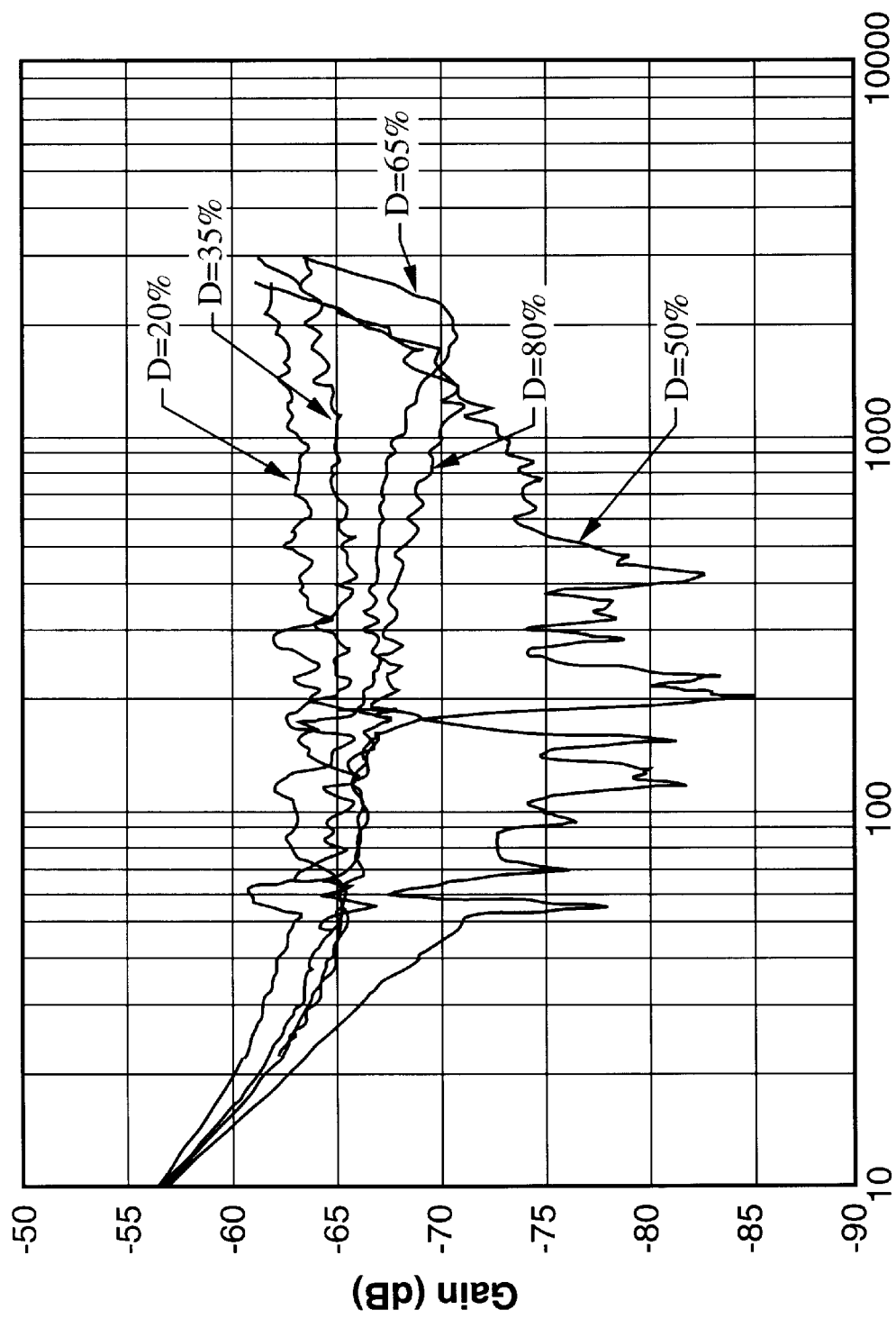
FIG. 18 is a graph showing the power supply ripple rejection for a DC output.

One of the unique characteristics of this control, is its ability to reject large signal power supply ripple. This significantly lowers the regulation requirement of the $V_g$ source. In the experimental system a bridge rectifier with a small capacitor filter was used. The ripple on the power supply was eight volts at full power (15% of the average 54 volts). FIG. 17 shows a time domain waveform of the ripple rejection capability of the system. Both the output voltage, $V_o$, and the power supply, $V_g$ are shown. Even with this 15% ripple, the output voltage shows no effect. The inverse of $V_g$, $-V_g$, is also shown to give a bottom reference for the negative output voltage, but there is only one power source. To further quantify the ripple rejection ability of the system, the PSRR test was performed by inducing an intentional ripple in the power supply of 20% ($V_g$=45+4.5 $\sin(\omega_g t)$). The frequency of the ripple was then swept and the gain of the power supply ripple to output is shown in FIG. 18 for different DC $V_{ref}$ signals represented by duty ratio. FIG. 18 shows the excellent power supply ripple rejection this control method obtains. Low frequency noise is attributed to the slight rise in rejection below 60 Hz. At 120 Hz, the fundamental of an AC-DC rectifier, the rejection is more than 63 dB.

D. Experimental fs Variation by $V_{ref}$

Figure 19:
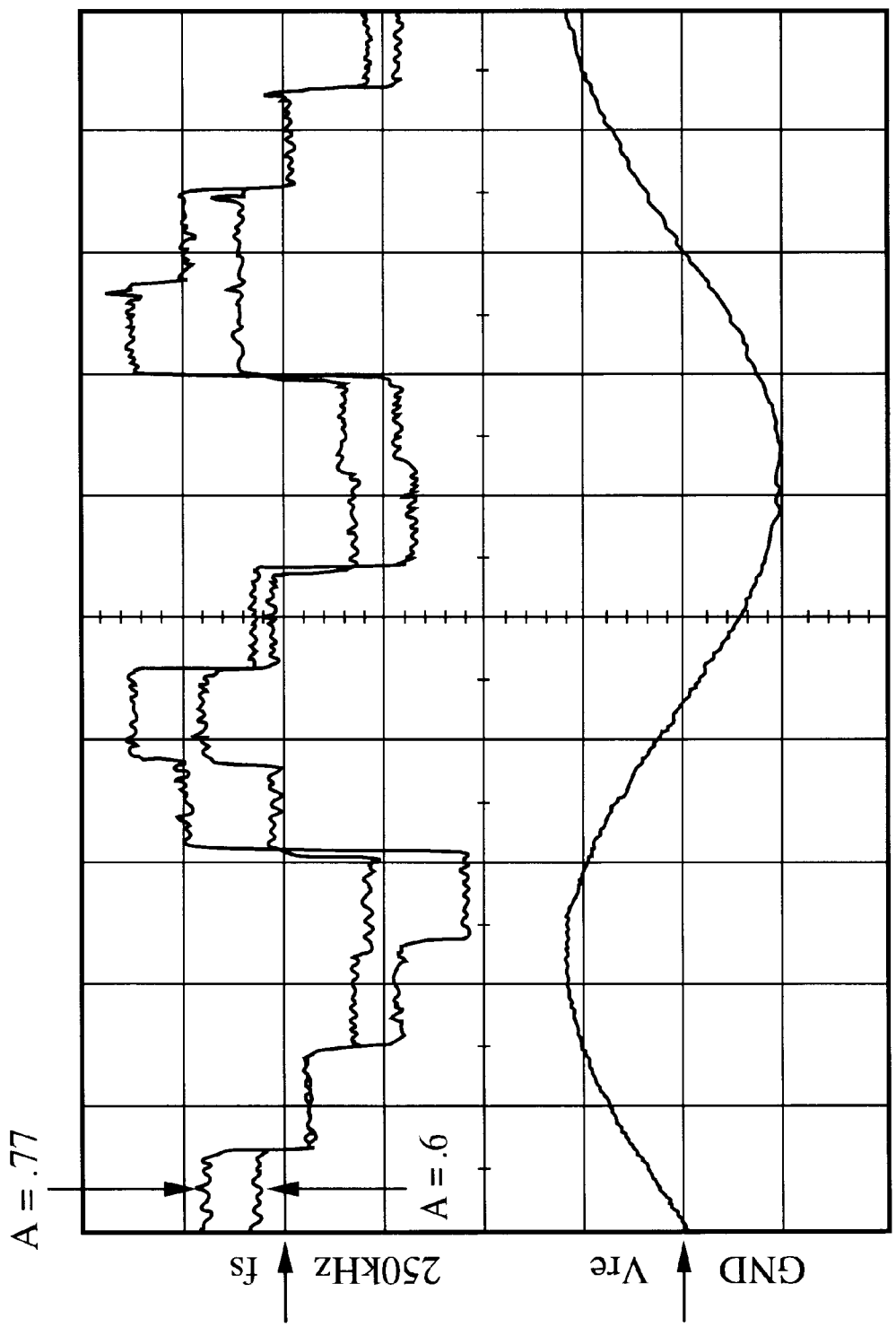
FIG. 19 is a plot showing the experimental switching frequency variation due to reference signal.

Using a time-to-voltage converter (Tektronix TVC501), the switching frequency variation was tested for a sinusoidal control reference signal shown in FIG. 19. The frequency of the reference signal frequency is 25 kHz, ($F_s/f_{ref}$=10) and the test was performed for normalized peak reference voltages of 0.77 and 0.6. The results match well with the theoretical prediction shown in FIG. 10. The maximum variation is less than ±25 KHz (±10%).

E. Harmonic Distortion

An Audio Precision System One™ instrument was used to test the THD+N and the CCIF intermodulation distortion. For the THD+N tests, the upper bandwidth of the System One input filter was set to 80 kHz. For the CCIF intermodulation distortion tests, two tones at 19$k$ and 20$k$ were set and the distortion component at 1 kHz was measured versus output power.

Figure 20:
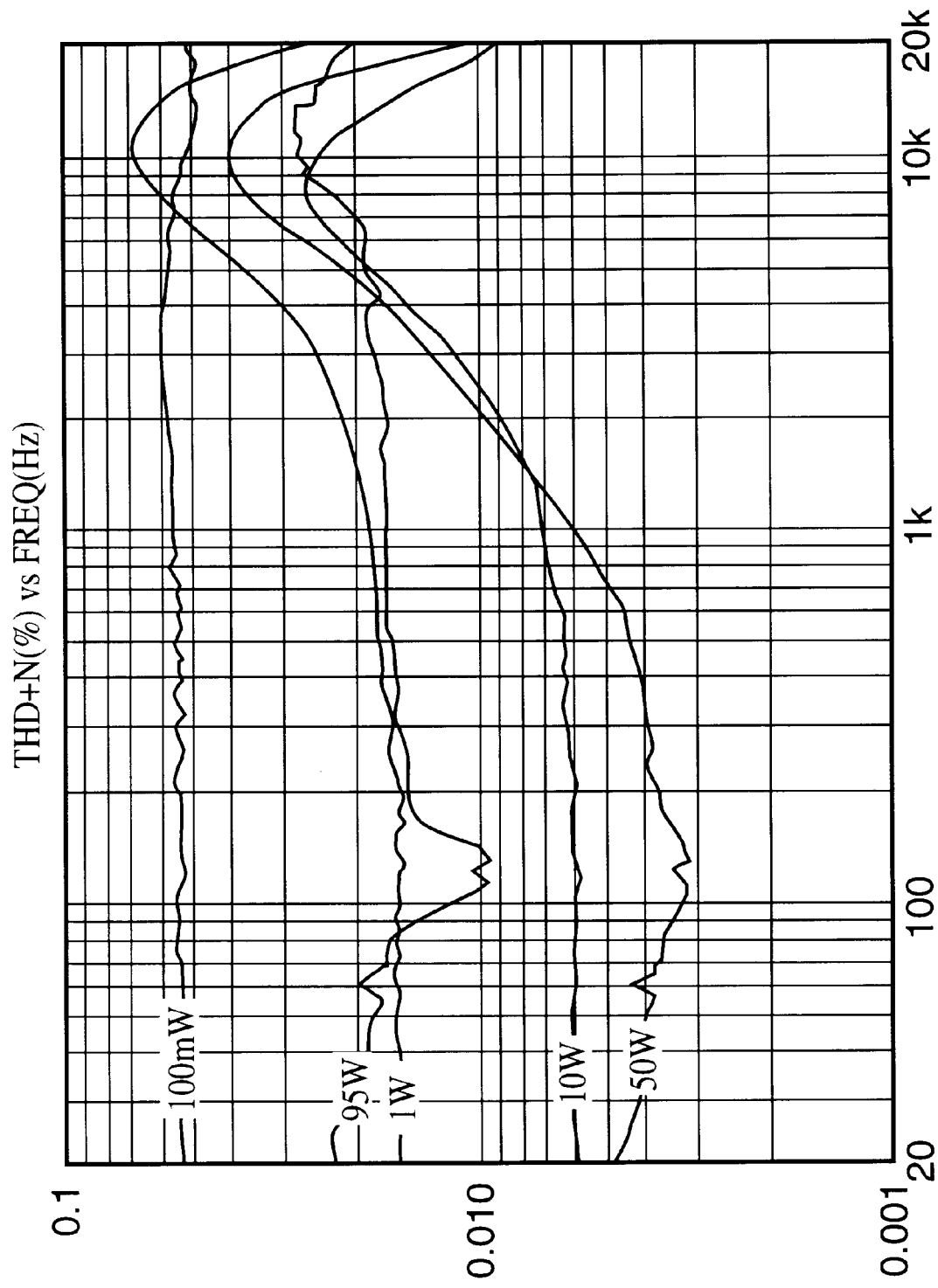
FIG. 20 is a graph showing THD vs. frequency.
Figure 21:
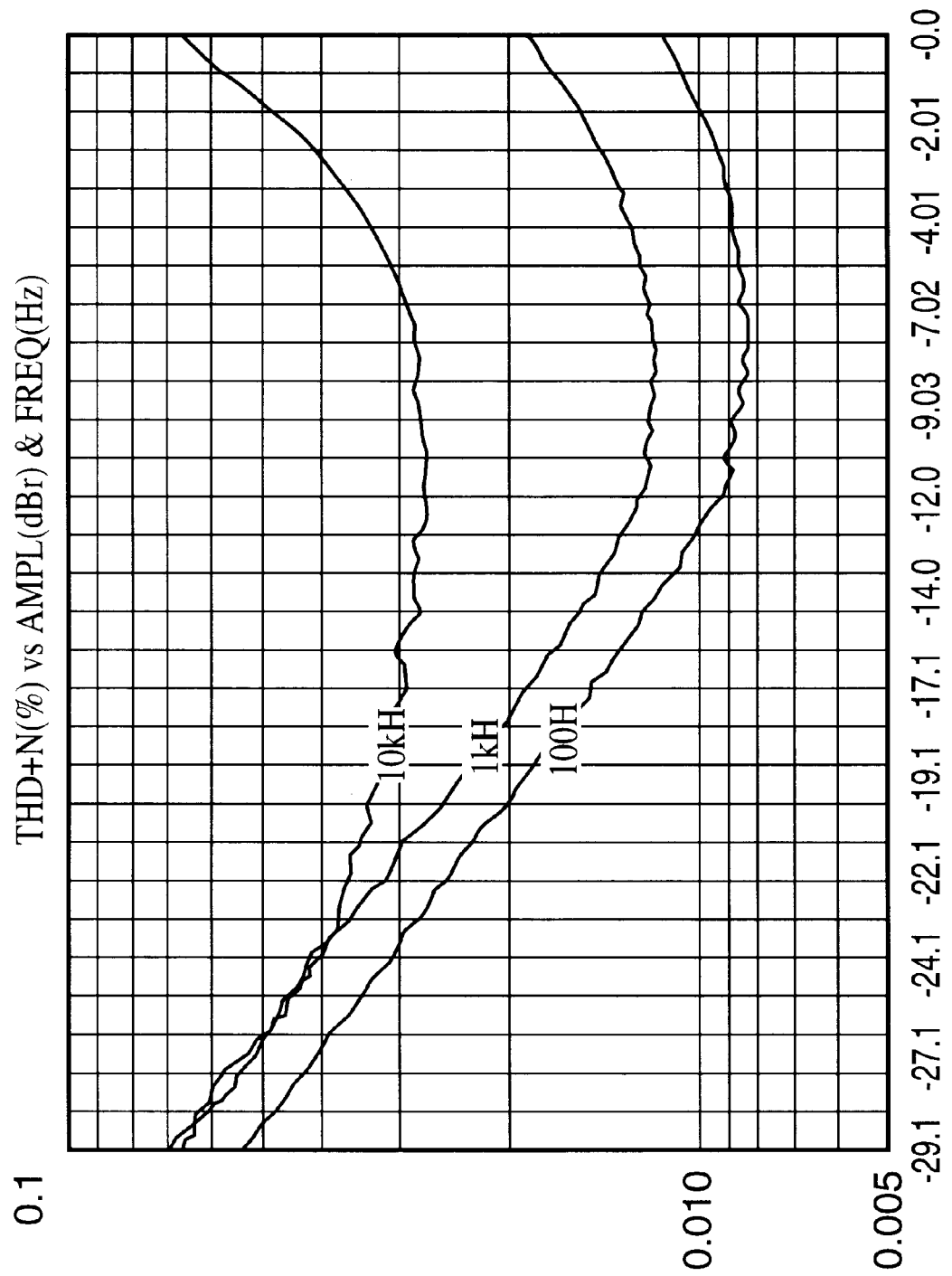
FIG. 21 is a graph showing THD+N vs. amplitude relative to maximum output voltage.

The THD+N response of the amplifier is shown in FIG. 20 for different values of output power. Even with an unregulated power supply, $V_g$, with a 15% ripple, the results show less than 0.07% THD+N over the complete frequency range. FIG. 21 shows similar results for THD+N vs. amplitude for several frequencies. The amplitude is relative to the full power output voltage (−29.1 dB corresponds to 100 m Watt).

Figure 22:
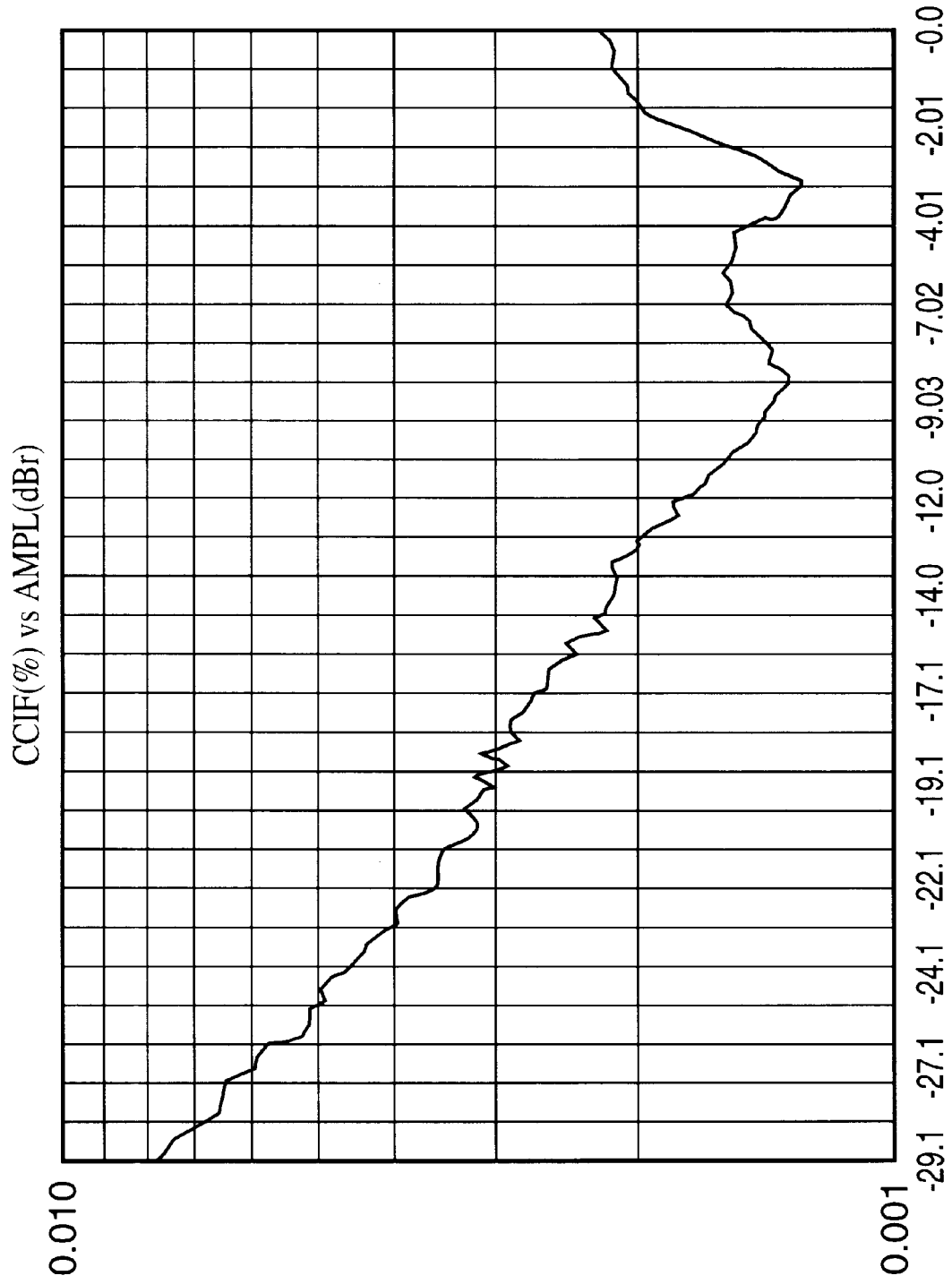
FIG. 22 is a graph showing CCIF intermodulation distortion vs. output level with tones at 19 kHz and 20 kHz.

The CCIF response is shown in FIG. 22 where the output level is relative to the output at full power. The distortion level is less than 0.008%.

F. Frequency Response

Figure 23:
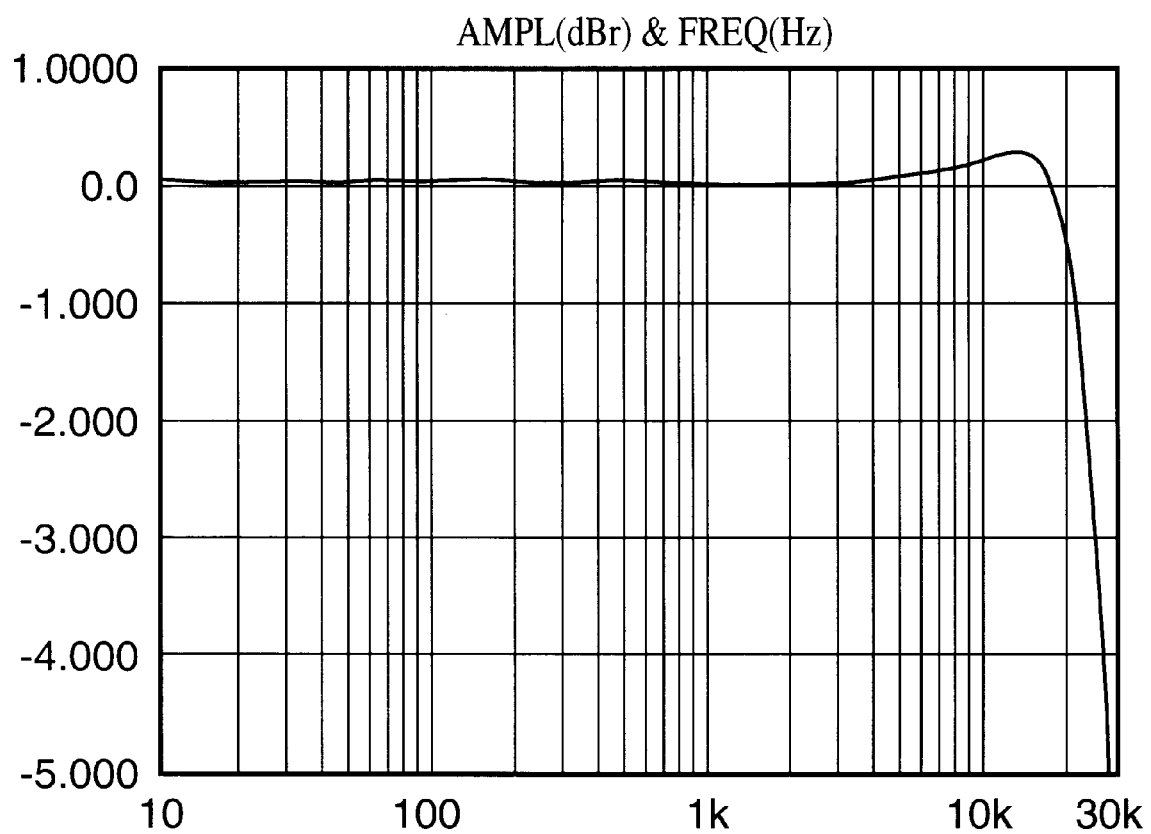
FIG. 23 is a graph showing audio amplifier frequency response.

Using an Audio Precision System One™ instrument, the large signal frequency response of the experimental audio amplifier normalized frequency response $V_{ref}$ was measured and shown in FIG. 23, where the magnitude is relative to the full power output voltage.

As can be seen, therefore, the present invention comprises a new non-linear control technique that provides one cycle response and nearly constant frequency without a resettable integrator in the control path. It combines the performance characteristics of the constant frequency one cycle control in U.S. Pat. No. 5,278,490 without the need of a fast integrator reset circuit to minimize signal distortion. The theoretical equations for the control circuit are derived for any buck related switched network where a switched-variable is to be controlled. To obtain nearly constant switching frequency, the pulse width of the one shot is modulated by a simple circuit. Due to changing power supply and reference signals and non-ideal circuit delays, there will be some variation in switching frequency. Numerical analysis demonstrated that the effect of a changing power supply has little effect on the switching frequency. The changing reference signal vs. switching frequency variation analysis shows that double-edge modulation obtains excellent improvement over single-edge modulation. The non-ideal circuit delay induced switching frequency variations were analyzed and simple solutions were provided.

The low distortion levels, excellent PSRR results, and simplicity of construction make this method exceptionally suited for control of demanding switching audio amplifier applications. The THD+N distortion level achieved with this proposed circuit is comparable to commercial high fidelity linear audio amplifiers. Since the power semiconductors are operating in PWM mode, much higher efficiency (thus smaller size) can be obtained. Because the method ensures that the error between the reference and the switching variable is zero each cycle, it rejects power supply disturbances. Therefore, the bus voltage for the full bridge needs little or no regulation. This same characteristic also allows switch asymmetries and non-ideal switching edges. Consequently, the switches do not have to be matched and soft switching circuits can be readily employed with theoretically zero effect on the performance levels. Since the control strategy has inherent feedforward and feedback properties without a physical dynamic feedback loop, stability is guaranteed. Space-based converters are another possible application for this control method where precision, stability, reliability, and noise rejection are crucial.

A 95 Watt RMS power and 0–20 kHz bandwidth full bridge amplifier was built to verify the applicability of the control to high fidelity audio applications. The results show THD+N levels below 0.07%, CCIF intermodulation distortion below 0.008%, and PSRR levels greater than 63 dB at 120 Hz.

Although the description above contains many specificities, these should not be construed as limiting the scope of the invention but as merely providing illustrations of some of the presently preferred embodiments of this invention. Thus the scope of this invention should be determined by the appended claims and their legal equivalents.

TABLE 1

Switched-variable values for some switching converters

| Converter | Edge modul. | $V_{p1}$ | $V_{p2}$ | $t_{one}/T_s$ |
| --- | --- | --- | --- | --- |
| Buck | trailing | $V_g$ | 0 | $V_{ref}/V_g$ |
| Buck | leading | 0 | $V_g$ | $(V_g - V_{ref})/V_g$ |
| Half Bridge | trailing | $V_{g1}$ | $V_{g2}$ | $(V_{ref} - V_{g1})/(V_{g1} - V_{g2})$ |
| Half-Bridge | leading | $V_{g2}$ | $V_{g1}$ | $(V_{ref} - V_{g1})/(V_{g2} - V_{g1})$ |
| Full Bridge | trailing | $V_g$ | $-V_g$ | $(V_g + V_{ref})/2V_g$ |
| Full Bridge | leading | $-V_g$ | $V_g$ | $(V_g - V_{ref})/2V_g$ |

TABLE 2

State assignment and output values

| State | Description | Q1 | Q2 |
|---|---|---|---|
| S1 | One shot: $V_p = -V_g$ | 0 | 0 |
| S2 | $V_E$ returns to zero: $V_p = V_g$ | 1 | 1 |
| S3 | One Shot: $V_p = V_g$ | 1 | 0 |
| S4 | $V_E$ returns to zero: $V_p = -V_g$ | 0 | 1 |

What is claimed is:

1. A PWM controller for controlling a switched variable with one cycle response, comprising:
   (a) an error integrator circuit;
   (b) a first comparator circuit; and
   (c) an adjustable width one-shot pulse circuit comprising
      (i) a resettable integrator having an input, an output and a reset input,
      (ii) a second comparator having an input coupled to the output of said resettable integrator, and
      (iii) a flip-flop, said flip flop having a set input coupled to the output of said first comparator circuit, a reset input coupled to the output of said second comparator, an output for controlling said switched variable, and an inverted output coupled to the reset input of said resettable integrator;
   (d) wherein activation of said one-shot pulse circuit triggers a change in state of said switched variable, wherein error between the switched variable and a reference signal is integrated by said error integrator circuit and compared with a fixed voltage by said first comparator circuit, wherein said first comparator circuit triggers said one shot pulse circuit when said error is integrated to zero, and wherein the pulse width of said one-shot pulse circuit is adjusted each switching cycle to achieve approximately constant switching frequency of the switched variable.

* * * * *